(12) United States Patent
Mastin et al.

(10) Patent No.: US 9,184,350 B2
(45) Date of Patent: Nov. 10, 2015

(54) LIGHT EMITTING DEVICE FOR ILLUMINATING PLANTS

(71) Applicant: VENNTIS TECHNOLOGIES LLC, Holland, MI (US)

(72) Inventors: Jeffrey L. Mastin, Holland, MI (US); William D. Schaefer, Holland, MI (US); Daniel J. Fisher, Holland, MI (US); Jamie C. Caldwell, Holland, MI (US); David W. Caldwell, Holland, MI (US); Justin T. Teitt, Holland, MI (US)

(73) Assignee: VENNTIS TECHNOLOGIES LLC, Holland, MI (US)

( * ) Notice: Subject to any disclaimer, the term of this patent is extended or adjusted under 35 U.S.C. 154(b) by 0 days.

(21) Appl. No.: 14/311,722

(22) Filed: Jun. 23, 2014

(65) Prior Publication Data

US 2014/0374780 A1 Dec. 25, 2014

Related U.S. Application Data

(60) Provisional application No. 61/837,673, filed on Jun. 21, 2013.

(51) Int. Cl.
*H01L 33/00* (2010.01)
*H01L 33/50* (2010.01)
(Continued)

(52) U.S. Cl.
CPC ............... *H01L 33/50* (2013.01); *H01L 27/15* (2013.01); *H01L 33/507* (2013.01); *H01L 33/58* (2013.01); *H01L 33/54* (2013.01); *H01L 33/60* (2013.01); *H01L 2933/0091* (2013.01)

(58) Field of Classification Search
CPC ........ H01L 27/288; H01L 27/32; H01L 33/08
See application file for complete search history.

(56) References Cited

U.S. PATENT DOCUMENTS 7,781,783 B2 8/2010 Yen et al.
2011/0215707 A1* 9/2011 Brunt et al. .................. 313/483
(Continued)

FOREIGN PATENT DOCUMENTS

| KR | 100879711 B1 | 1/2009 |
|---|---|---|
| WO | 2010053341 A1 | 5/2010 |
| WO | 2012060648 A2 | 5/2012 |

OTHER PUBLICATIONS

Yeong Gwan Park, International Search Report, 4 pages, Oct. 24, 2014, Republic of Korea.
(Continued)

*Primary Examiner* — Elias M Ullah
(74) *Attorney, Agent, or Firm* — McGarry Bair PC

(57) ABSTRACT

A spectrally adapted light emitting device for illuminating plants includes at least one semiconductor light-emitting diode (LED), at least one light conversion element for down-converting a portion of light emitted at the first wavelength to at least a second wavelength between 600 nm-680 nm, and at least one scattering device to diffuse light within the light emitting device. The at least one LED is configured to emit at least a first wavelength between 400 nm and 480 nm. The spectral light output from the spectrally adapted light emitting device is bi-modal with wavelengths in a range of 400 nm and 800 nm including a first local maximum between 400 nm and 480 nm and a second local maximum between 600 nm-680 nm with a local minimum between the first local maximum and the second local maximum.

22 Claims, 23 Drawing Sheets

(51) Int. Cl.
  *H01L 27/15*  (2006.01)
  *H01L 33/58*  (2010.01)
  *H01L 33/60*  (2010.01)
  *H01L 33/54*  (2010.01)

(56) References Cited

U.S. PATENT DOCUMENTS

2013/0047503 A1  2/2013  Aikala et al.
2014/0078746 A1  3/2014  Caldwell et al.

OTHER PUBLICATIONS

Jacob A. Nelson and Bruce Bugbee, Economic Analysis of Greenhouse Lighting: Light Emitting Diodes vs. High Intensity Discharge Fixtures, PLoS One, Published online Jun. 6, 2014, 8 pages, http://www.ncbi.nlm.nih.gov/pmc/articles/PMC4048233/.

Kevin M. Folta and Kayla Shea Childers, Light as a Growth Regulator: Controlling Plant Biology with Narrow-bandwidth Solid-state Lighting Systems, HortScience, Dec. 2008, vol. 43 No. 7, 14 pages, http://hortsci.ashspublications.org/content/43/7/1957.full.

Sander W. Hogewoning, Emilie Wientjes, Peter Douwstra, Govert Trouwborst, Wim Van Ieperen, Roberta Croce, Jeremy Harbinson, Photosynthetic Quantum Yield Dynamics: From Photosystems to Leaves, The Plant Cell, May 2012 vol. 24 No. 5 1921-1935, 3 pages, http://www.plantcell.org/content/24/5/1921.abstract.

K.J. McCree, The action spectrum, absorptance and quantum yield of photosynthesis in crop plants, ScienceDirect Journals, Received Oct. 15, 1970, Available online Apr. 15, 2003, http://www.sciencedirect.com/science/article/pii/00021571900227?np=y.

Author Unknown, Absorption spectra of chlorophylls and bacteriochlorophylls, Jun. 10, 2014, 4 pages. http://www.bio.ku.dk/nuf/resources/scitab/chlabs/.

Govindjee, Emerson Enhancement Effect and Two Light Reactoins in Photosynthesis, 17 pages, Feb. 5, 2011, https://www.life.illinois.edu/govindjee/Electronic%20Publications/1963/1963_Gov.pdf.

* cited by examiner

LIGHT EMITTING DEVICE FOR ILLUMINATING PLANTS

This application claims the benefit of U.S. Provisional Application No. 61/837,673, filed Jun. 21, 2013, which is incorporated herein by reference in its entirety.

FIELD OF THE INVENTION

This invention relates generally to light sources and the manufacturing of light sources, and more particularly for solid-state light sources for illuminating plants.

BACKGROUND OF THE INVENTION

Greenhouses and other locations for growing various plants, such as vegetables, fruits, flowers and herbs, often include artificial lighting. The electrical requirements necessary to provide the lighting can account for a significant amount of the cost of growing or producing the plants. It is desirable, then, to provide an energy efficient light for the production of plants. Many lighting technologies for the provision of artificial lighting to plants act as supplemental lighting where sunlight is the primary light source. Increasingly, artificial lights indoors provide 100 percent of the plant lighting without the benefit of the sun.

Designed for human lighting needs, existing lighting technologies for greenhouse applications are not optimal for plant growth. The response of a human eye to visible and near visible light differs from that of plants. As shown in FIG. 1, the human eye responds mostly in the visible light spectrum ranging from the green to orange wavelengths ranging from approximately 500 to 620 nanometers (nm) with a strong yellow component, with a total range from about 400 to 700 nm, with a peak around 555 nm. However, as shown in FIG. 2 and FIG. 3, plants are most responsive to the visible light spectrum corresponding to a first peak in the blue light region around 430 to 460 nm and a second peak in the red region around 640 to 660 nm.

Specifically, for the photosynthetically action radiation (PAR) range of the spectrum, chlorophyll absorption is maximized in the blue and red regions of the visible spectrum and total photosynthetic efficiency is maximized in the red region with a second local maximum in the blue region. Consequently, plant response from chlorophyll absorption is minimal in the areas of the visible spectrum that the human eye finds most responsive and maximal in the areas of the visible spectrum where the human eye is not very responsive. Therefore, lighting designed for the human eye uses energy and outputs light in areas of the visible spectrum least conducive to plant growth.

In addition to chlorophyll, plants include a variety of photoreceptors, each with an individual response as shown in FIG. 3. A broad and complex spectrum of visible light that emphasizes aspects of the blue and red spectral absorption regions is necessary to stimulate plant growth especially due to these absorption regions. For plant growth, blue light is integral for plant processes including the regulation of plant morphology, gene expression, transition to flowering, leaf expansion, phototropism, stem elongation, chloroplast positioning, gas exchange and mRNA stability. Deficiencies in blue light can negatively affect plant growth. Likewise, visible light ranging from orange to red light affects, among other things, the flowering and fruiting cycle. The most important consideration for plant growth and the design of the spectral output of lighting is the process of photosynthesis that is regulated predominantly by chlorophyll-a and chlorophyll-b. A properly broad spectrum that emphasizes the absorption regions in the blue and red spectral bands and subdues the light ranging from the green to yellow wavelengths will stimulate the plant's photoreceptors for efficient and proper growth.

Many of the lighting technologies used in grow light applications, while claiming to be beneficial to growing plants, do not provide much of their light output in the spectrum that would be most beneficial to plant growth. Additionally, much of the output light energy is in the region of the spectrum (e.g. the green to yellow wavelengths) that is either less useful or deleterious to plant growth. For example, consider FIG. 4, which shows a plot of the photon distribution versus wavelength for light output from a typical metal halide lamp used for a grow light. Metal halide lamps used for grow lighting have output peaks in the blue, green and yellow areas of the PAR spectrum. While the blue light output around 434 nm has photomorphogenic benefits including stem elongation inhibition and proper pigmentation stimulation, the large light output in the yellow and green spectra (e.g. the peaks at 545, 577 and 588 nm) and minimal light output in the red spectrum results in inefficient overall growth-stimulating light output. Furthermore, for plants to properly flower and fruit they generally require stimulation by the correct balance of red (i.e. 620 to 700 nm wavelength) and far red (i.e. 700 to 750 nm wavelength) light, which is lacking in metal halide lamps.

Referring now to FIG. 5, a plot of the photon distribution versus wavelength for light output from a typical high pressure sodium lamp used for a grow light is shown. High pressure sodium bulbs, like metal halide bulbs, generate a spectrum determined by the emission spectra of the elements inside. High pressure sodium lights output predominantly green, yellow and orange emission peaks. This emission pattern is more effective at stimulating growth than that of metal halide, but still not optimal for plant efficiency. High pressure sodium lights do not output much light below 500 nm. Consequently, high pressure sodium lights do not efficiently stimulate the photomorphogenic responses controlling plant shape and many other pigments, such as antioxidant anthocyanins and coloration pigments. Furthermore, for plants to properly flower and fruit, they generally require stimulation by the correct balance of red (i.e. 620 to 700 nm) and far red (i.e. 700 to 750 nm) light, which is lacking in high pressure sodium lights.

Referring now to FIG. 6, a plot of the photon distribution versus wavelength for light output from a typical fluorescent lamp used for a grow light is shown. Fluorescent lamp spectra bear a strong resemblance to the metal halide spectrum discussed above. Consequently, the overall effectiveness of fluorescent lamps as a grow light is similar to that of a metal halide lamp. Furthermore, fluorescent lamps generally output low photon levels relative to the requirements of plants and have short lifespans. Therefore, greenhouse environments require many units and a large amount of fixture space to achieve high light levels for plant growth and the lights are a constant source of maintenance.

Referring now to FIG. 7, a plot of the photon distribution versus wavelength for light output from a typical incandescent lamp used for a grow light is shown. Rarely used for supplemental lighting in a greenhouse environment, incandescent bulbs are inefficient at generating light in comparison to other lighting technologies. Red and far red wavelengths of light dominate the output spectrum of an incandescent bulb. Because high pressure sodium, metal halide and fluorescent lights have a very minimal far red content, incandescent bulbs remain useful for greenhouse environments for the purpose of daylength extension. However, the high proportion of far red light with respect to blue light may trigger shade avoidance responses in plants, such as stem elongation, that are often undesirable.

Recently, grow light technology may include light-emitting diodes (LED) as artificial light sources. Compared to other lighting technologies like metal halide, high pressure sodium, fluorescent and incandescent, LED lighting enables a potential reduction in energy usage. In addition, LEDs have a long life with many of the LEDs on the market rated at 50,000 hours and above. Since LEDs are a type of silicon semiconductor, LEDs output light when power is applied and do not waste energy by heating up gases or filaments that give off light like many of the other lighting technologies. Moreover, because LEDs radiate a fraction of the heat as compared to other lighting technologies, plants may be in close proximity to the LED light sources without suffering heat damage. The distance from the plants to the LED light sources may be as little as twelve inches or less.

Two key measurements when defining an LED lighting spectrum are the peak or maximum wavelength and the full-width half maximum (FWHM). The peak wavelength of the output spectrum is the wavelength of light where a global or local maximum occurs. The FWHM is the extent of the range of wavelengths on either side of the peak where the output spectrum is equal to half of the peak value. Typically, a single LED provides a narrow operable wavelength band. For wavelengths in both the blue and red regions, the FWHM is typically in the range of 15 to 25 nm FIG. 8 illustrates the spectral output of a popular brand of LED grow light with a local peak in the blue region (i.e. around 430 nm) and a local peak in the red region (i.e. around 660 nm) of the visible light spectrum where the FWHM is around 18 to 22 nm. The FWHM does not meet the wavelength range needed by most plants and, consequently, limits the ability of the LED lighting to provide the light most useful for plant growth. Overcoming this limitation by designing an output light spectrum for an LED grow light with a collection of individual LEDs with different narrow FWHMs is difficult and expensive. Additionally, LED dies other than blue and red suffer reduced electrical efficiencies, especially the green and far red dies that would broaden the LED grow light spectrum.

Most LED products designed for growing plants do not provide a light spectrum optimal for plant growth, especially when used as the primary lighting source. Current LED lighting products for grow light applications use a collection or an array of various colored LED lights to approximate a desired light spectrum. The array can include individual blue LED lights, red LED lights, white LED lights or other colors and may be difficult to assemble the collection of individual LED lights to generate the desired light spectrum. Other types of LED light applications include an array at the die level where the arrangement and mixture of red and blue dies approximate a desirable spectral light output. Regardless of how the LED array is formed, spatially diverse colored LEDs create localized areas in the plant-growing environment with varying levels of either blue or red lighting with respect to the surrounding areas. Consequently, some areas in the plant-growing environment are subject to a non-optimal spectrum of light. With an array of LEDs, mixing light outputs of individual directional LED lights creates spectrum imbalances within the light coverage area.

Further exacerbating the problem, LEDs radiate photons in a highly directional pattern. Referring now to FIG. 9, the relative angular intensity of the light output of a typical LED is shown. The LED outputs a radiation pattern where the maximum intensity occurs longitudinally from the LED (i.e. at 0 degrees) and drops off to half the intensity in approximately 45 degrees. The directionality frequently creates hot spots in the plant growth area with hot areas receiving a disproportionate or excessive amount of light compared to cooler areas, greatly affecting the plant growth. Beyond LEDs, most of the current lighting technologies for grow lights do not provide uniform lighting. That is, the lights typically have hot spots directly below the light fixture, cold spots between light fixtures, and inconsistent light levels therebetween.

As shown in FIG. 10, it is known to form a white light LED as a volumetric light emitting device 10 where a phosphor blend is molded into a three-dimensional or volumetric light conversion element 12. The volumetric light emitting device 10 includes a first reflector 14 including an aperture 16 for a light source 18 or an emitter junction, a second reflector 20 opposite the first reflector 14 for reflecting light emitted by the light source 18, and a volumetric light conversion element 12 extending between at least a portion of the first reflector 14 and at least a portion of the second reflector 20. The volumetric light conversion element 12 includes phosphor particles 22 dispersed in a resin to convert light emitted by the light source 18 from a first wavelength 24 to a second wavelength 26, the second wavelength 26 being longer than the first wavelength 24. In this way, the volumetric light emitting device 10 manages and distributes blue light and down-converted white light. Specifically, the volumetric light emitting device 10 radiates the down-converted light in a toroidal or spherical pattern. An example of a volumetric light emitting device is illustrated by Caldwell et al in US Patent Application No. 2014/0078746. Another volumetric light emitting device is disclosed in Brunt et al. U.S. Pat. No. 8,646,949 which teaches a white light scintillator.

In most LED lighting applications, the management of heat is critical to the operability of the lighting device. An LED maintaining a lower junction temperature has a longer life expectancy than when operated at a higher junction temperature. For lighting applications where LEDs are coated with phosphors, the heat generated by the LED and the heat generated by phosphor down-conversion is typically absorbed and transferred within a heat sink attached either directly to the LED or the printed circuit board (PCB) upon which the LED is mounted. In this way, conventional LED lighting applications rely on the design of the heat sink to maintain the life expectancy of the light source by maintaining a desired LED junction temperature.

In a volumetric light emitting device 10 of the type described in FIG. 10, the phosphor material that forms the volumetric light conversion element 12 is not located on or directly adjacent to the LED light source 18 and the corresponding heat sink (not shown, but either directly attached to the LED light source 18 or the PCB 19). Consequently, much of the heat generated from down-conversion does not transfer efficiently to the heat sink.

Light with a first wavelength 24 emitted from the LED light source 18 passes through a clear encapsulant 17, excites a phosphor 22 that emits light of a down-converted second wavelength 26 within the volumetric light conversion element 12 and generates heat. The heat will then generally find an exit path through the resin material in which the phosphors 22 are embedded, transfer to the sides and top of the volumetric light conversion element 12 and dissipate through convection, conduction or radiation.

A hot spot may form in the volumetric light emitting device 10. The hot spot is a localized volume in the volumetric light conversion element 12 where a concentration of down-conversion creates a localized higher temperature with respect to the overall average temperature of the volumetric light conversion element 12. A higher localized temperature may prematurely degrade the phosphor materials, the resin material, and encapsulant. Furthermore, phosphors become less efficient at higher temperatures emitting less light than at lower temperatures. The hot spot occurs, in part, because the phosphors 22 are dispersed in a homogenous fashion throughout the resin that defines the volumetric light conversion element 12. The host resin material may include many materials, such as a hardened silicone. The thermal conductivity for such a host material is typically much less than the thermal conductivity of the heat sink material, which is often aluminum or a highly thermally conductive thermoplastic. Hot spots are especially problematic if the heat created exceeds the material property specification of the resin material, the encapsulant or the phosphor materials.

Despite the homogeneous distribution of the phosphors 22 in the volumetric light conversion element 12, the distribution of the excitation of the phosphors 22 in the volumetric light emitting device 10 is not homogeneous throughout the volumetric light conversion element 12. Rather, there is a higher concentration of phosphor excitement where the light of the first wavelength 24 from the LED light source 18 initially contacts the phosphors at the interface between the encapsulant 17 and the volumetric light conversion element 12.

The maximum temperature inside the volumetric light conversion element 12 depends on several factors including the output power of the LED light source 18, the interface area between the encapsulant and the phosphors, the type of phosphors 22, the thermal conductivity of the materials, the exterior geometry, and the ambient temperature surrounding the volumetric light conversion element 12. Many of the LED light sources used today have very high power densities emitting a lot of light into a very small area.

In addition to the problems relating to a hot spot in the volumetric light conversion element, prior art volumetric light emitting devices that produce white light have been designed and are observed to shift the spectral output of a phosphor and LED. The shifted spectral output of the volumetric light emitting device enhances the spectral output of the green to yellow wavelengths and shifts the blue and red peaks towards the center of the visible spectrum.

BRIEF DESCRIPTION OF THE INVENTION

One aspect of the invention relates to a spectrally adapted light emitting device for illuminating plants. The device comprises at least one semiconductor light-emitting diode (LED), at least one light conversion element for down converting a portion of light emitted at the first wavelength to at least a second wavelength between 600 nm and 680 nm, and at least one scattering device to diffuse light within the light emitting device. The at least one LED is configured to emit at least a first wavelength between 400 nm and 480 nm. The spectral light output from the spectrally adapted light emitting device is bi-modal with wavelengths in a range of 400 nm and 800 nm including a first local maximum between 400 nm and 480 nm and a second local maximum between 600 nm and 680 nm with a local minimum between the first local maximum and the second local maximum.

DESCRIPTION OF EMBODIMENTS OF THE INVENTION

In the background and the following description, for the purposes of explanation, numerous specific details are set forth in order to provide a thorough understanding of the technology described herein. It will be evident to one skilled in the art, however, that the exemplary embodiments may be practiced without these specific details. In other instances, structures and device are shown in diagram form in order to facilitate description of the exemplary embodiments.

Figure 1:
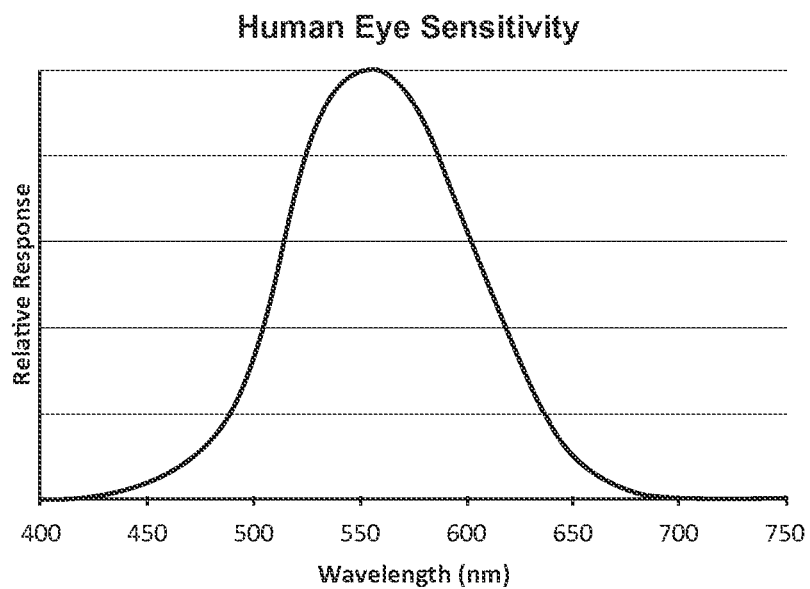
FIG. 1 illustrates a plot of the relative response of a human eye versus wavelength for visible light demonstrating the human eye's sensitivity to green to yellow wavelengths.
Figure 2:
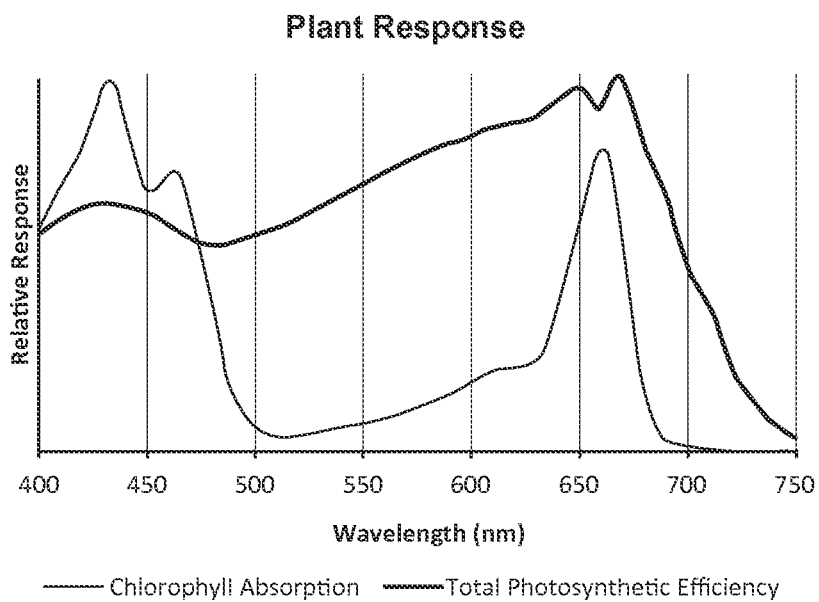
FIG. 2 illustrates a plot of the relative response of a plant for chlorophyll absorption and total photosynthetic efficiency versus wavelength for visible light.
Figure 3:
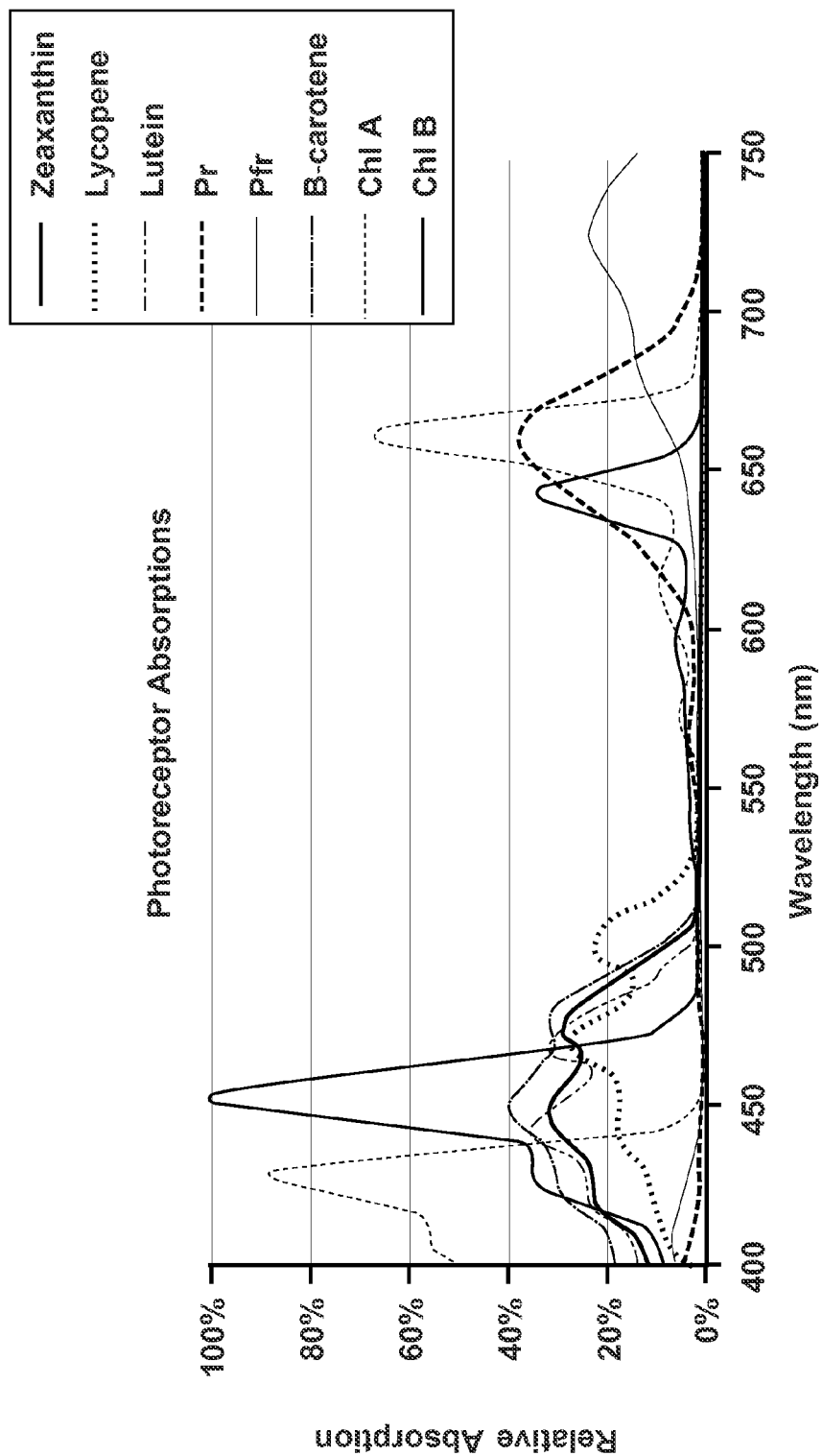
FIG. 3 illustrates a plot of the relative absorption of various photoreceptors critical to plant growth versus wavelength for visible light.
Figure 4:
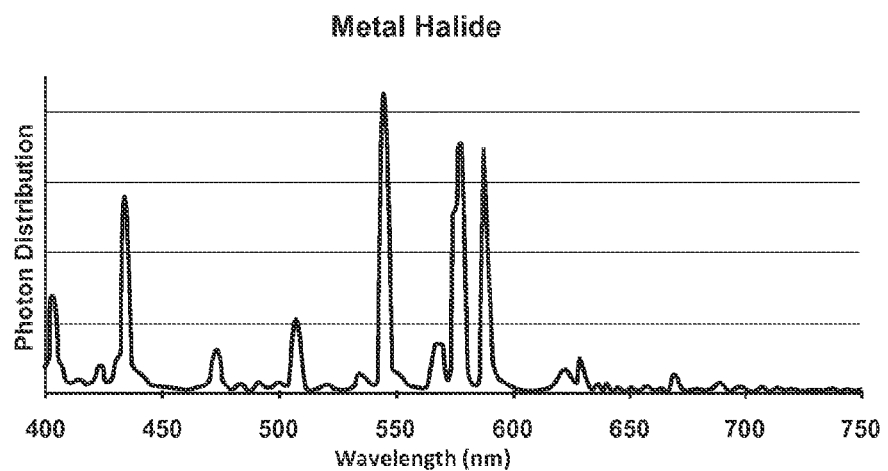
FIG. 4 illustrates a plot of the photon distribution versus wavelength for light output from a typical metal halide lamp used for a grow light.
Figure 5:
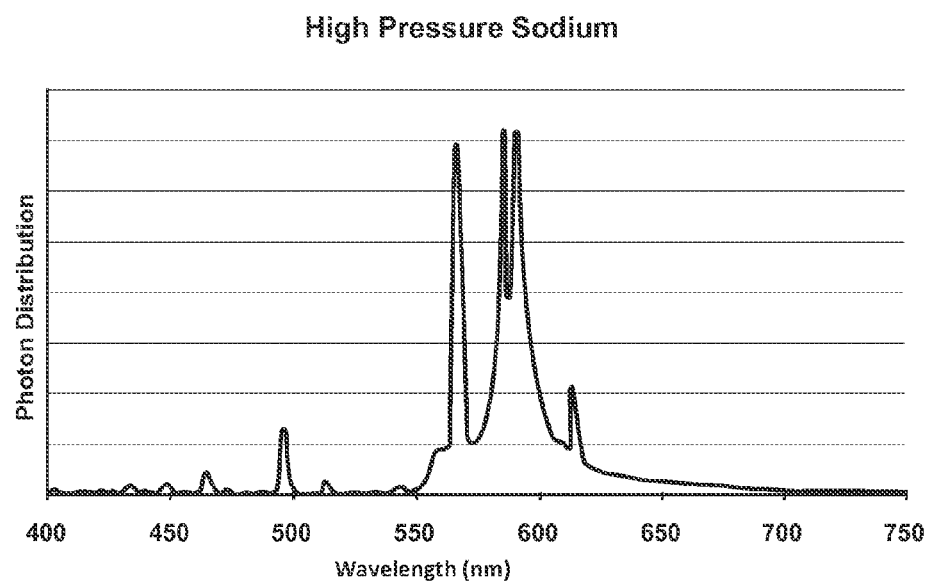
FIG. 5 illustrates a plot of the photon distribution versus wavelength for light output from a typical high pressure sodium lamp used for a grow light.
Figure 6:
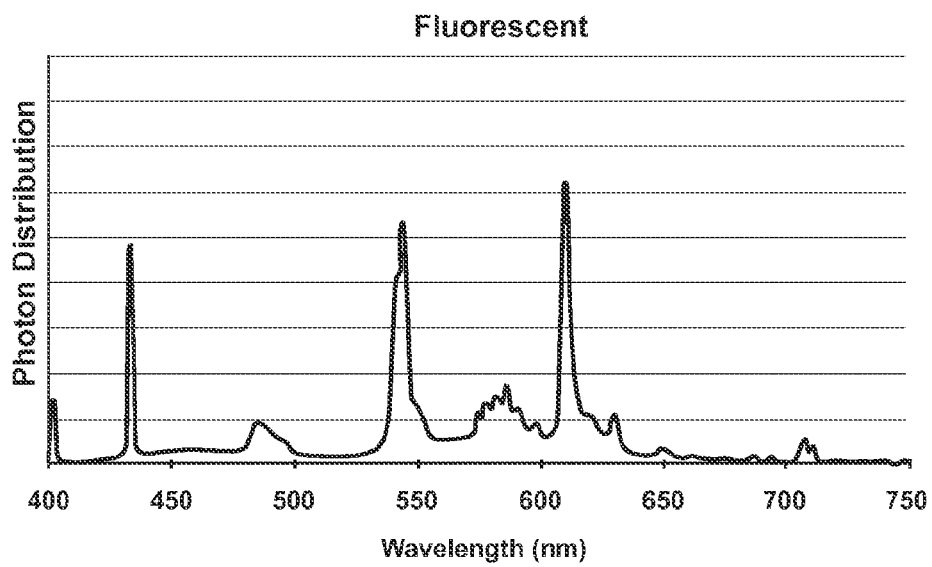
FIG. 6 illustrates a plot of the photon distribution versus wavelength for light output from a typical fluorescent lamp used for a grow light.
Figure 7:
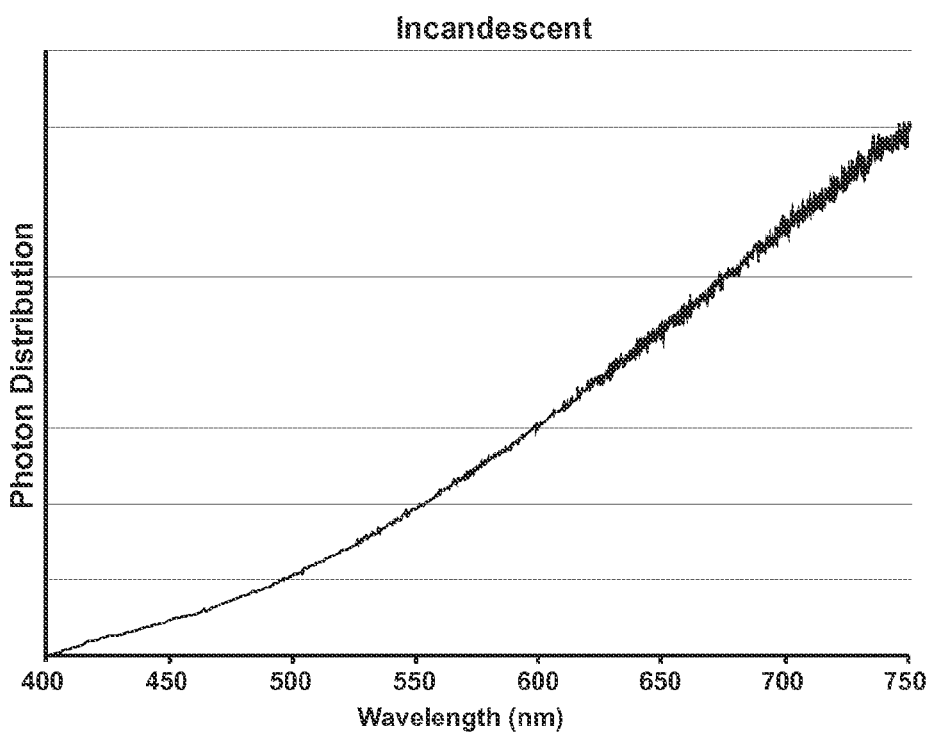
FIG. 7 illustrates a plot of the photon distribution versus wavelength for light output from a typical incandescent lamp used for a grow light.
Figure 8:
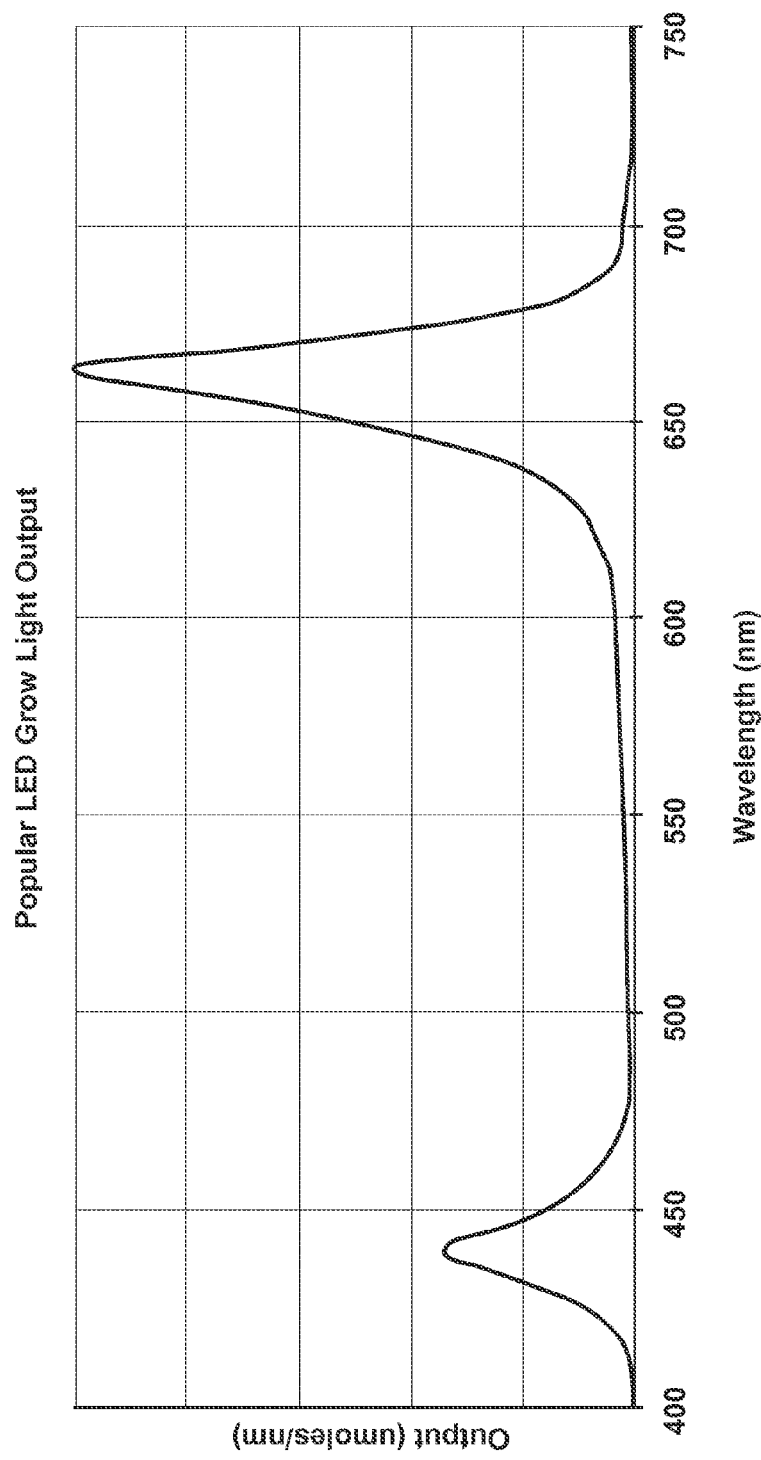
FIG. 8 illustrates the spectral output of a popular brand of LED grow light.
Figure 9:
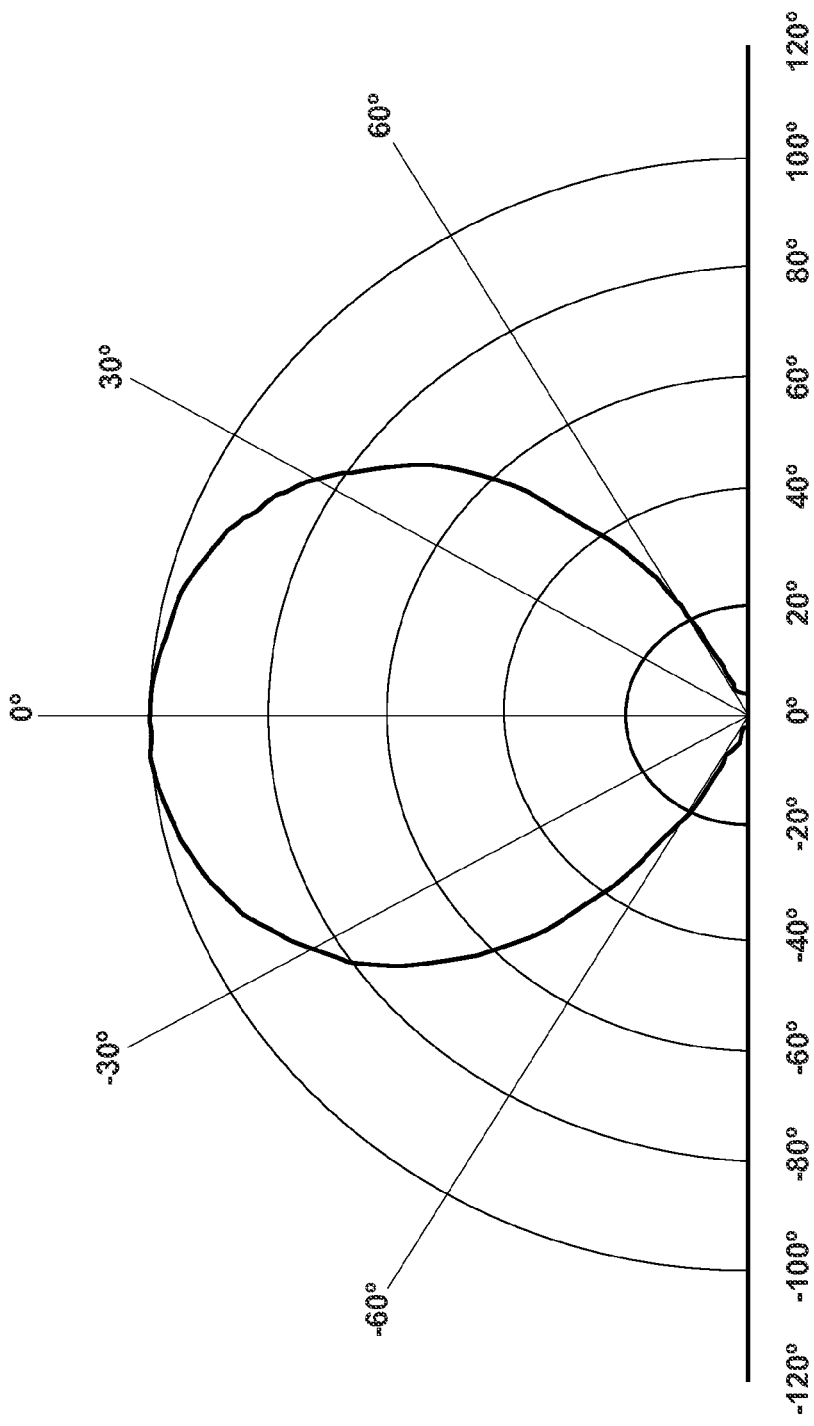
FIG. 9 illustrates the relative angular intensity of the light output of a typical LED.
Figure 10:
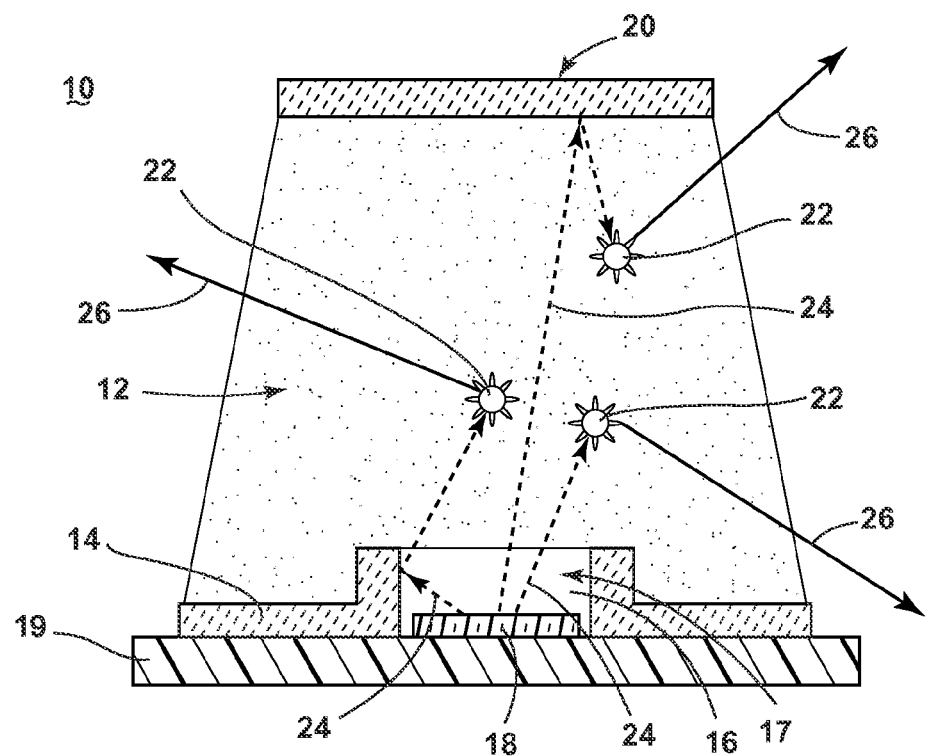
FIG. 10 illustrates a cross-sectional view of a prior art volumetric light emitting device.
Figure 11:
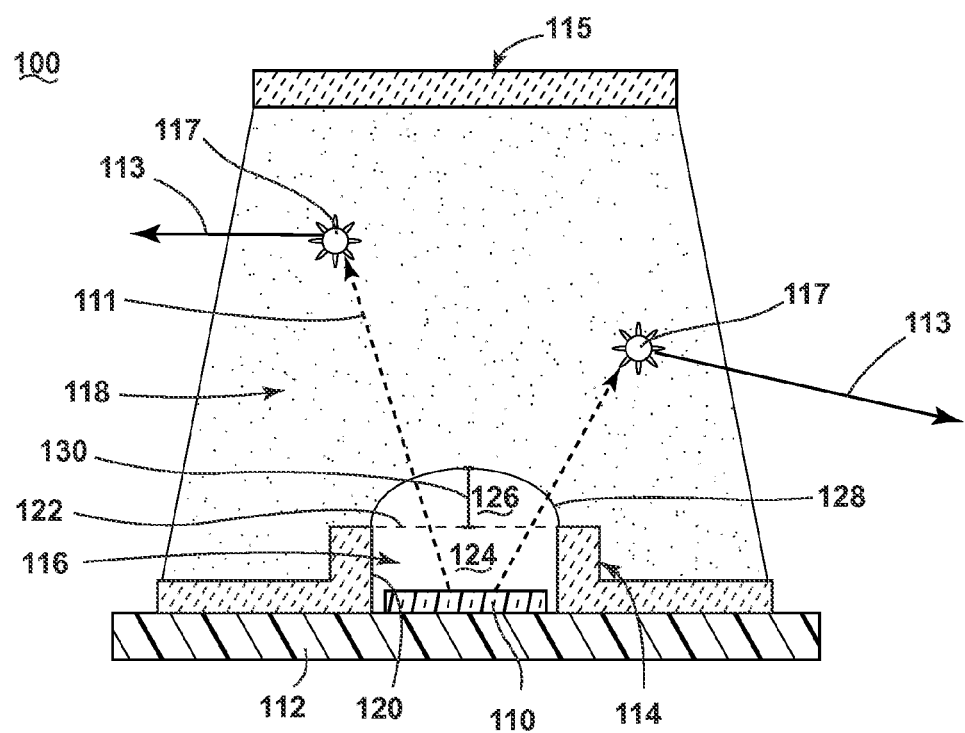
FIG. 11 illustrates a cross-sectional view of a volumetric light emitting device with a dome encapsulant.

FIG. 11 shows a cross section of a generally circular volumetric light emitting device 100 according to a first embodiment with an interface 128 between an encapsulant 116 and phosphor particles 117 in the volumetric light conversion element 118. The volumetric light emitting device 100 includes at least one semiconductor LED light source 110 disposed on a substrate 112. A reflector ring 114 extends axially from the substrate 112. The reflector ring surrounds the LED light source 110 and serves to reflect or redirect upward any side-emitted light from the LED light source 110. The encapsulant 116 encases the LED light source 110. A volumetric light conversion element 118 surrounds the reflector ring 114. The volumetric light conversion element 118 is adapted to down-convert light emitted from the LED light source 110 at a first wavelength 111 and emit the down-converted light at a second wavelength 113 as described above and includes the phosphor particles 117 dispersed in a host resin material. The phosphor mix may be formed of one or more types of phosphors, such as RR6436-02A-12 by Internatix with a peak wavelength of 629 nm, or Lightscape Aruba 630 phosphor with a peak wavelength of 630 nm, premixed into an acrylic, silicone, polycarbonate, Nylon, or other resins for injection molding. The encapsulant may include, for example, silicone.

The reflector ring 114 defines a first volume 124 that is bounded by the substrate 112, an inner wall 120 of the reflector ring 114 and a terminal plane 122 at a distal end of the reflector ring 114. A second volume 126 extends axially between the terminal plane 122 and the volumetric light conversion element 118. An upper reflector 115 spaced axially from the terminal plane 122 may provide an upper boundary for the volumetric light conversion element 118. Preferably, the upper reflector 115 is a diffusing element. That is, the upper reflector 115 may be a diffuse reflector upon which light is directed in random directions with respect to the angle of incidence. Other types of reflectors may include specular reflectors where light is directed substantially out of the volumetric light conversion element 118.

The height of the reflector ring may be close to or equal to the thickness of other lower reflector elements disposed on the substrate, or extend axially above the other lower reflector elements; the design height determined by desired optical parameters. The reflector ring may be molded or manufactured integral with the other lower reflector elements or the reflector ring may be separate from the other elements of the lower reflector. Additionally, it is contemplated that the lower reflector only comprises a reflector ring wherein portions of the substrate directly contacts the volumetric light conversion element 118 and may be reflective. The inner wall of the reflector ring can be a flat or curved surface formed to direct reflected light in optimal directions.

The second volume 126 may be formed as a dome and the encapsulant 116 fills both the first and second volumes 124, 126. By adding a dome of encapsulant at the top of the terminal plane 122, the surface area of the interface 128 between the encapsulant 116 and the volumetric light conversion element 118 is larger than if it were in a plane. That is, the area of the interface 128 is larger than that of the area of the intersection between the first and second volumes 124,126, thereby increasing the surface area of the interface between the encapsulant and phosphor dispersed in resin, thereby minimizing the maximum internal temperature from heat generated by phosphor down-conversion. For example, consider a volumetric light emitting device with an area of the intersection between the first and second volumes 124,126 with a diameter of 8.89 mm. By adding the second volume 126 of encapsulant 116 in the shape of a dome with a height 130 of 3 mm above the reflector ring 114, the surface area of the interface 128 increases from 62.2 $mm^2$ to 90.4 $mm^2$; an increase of approximately 45 percent.

Figure 12:
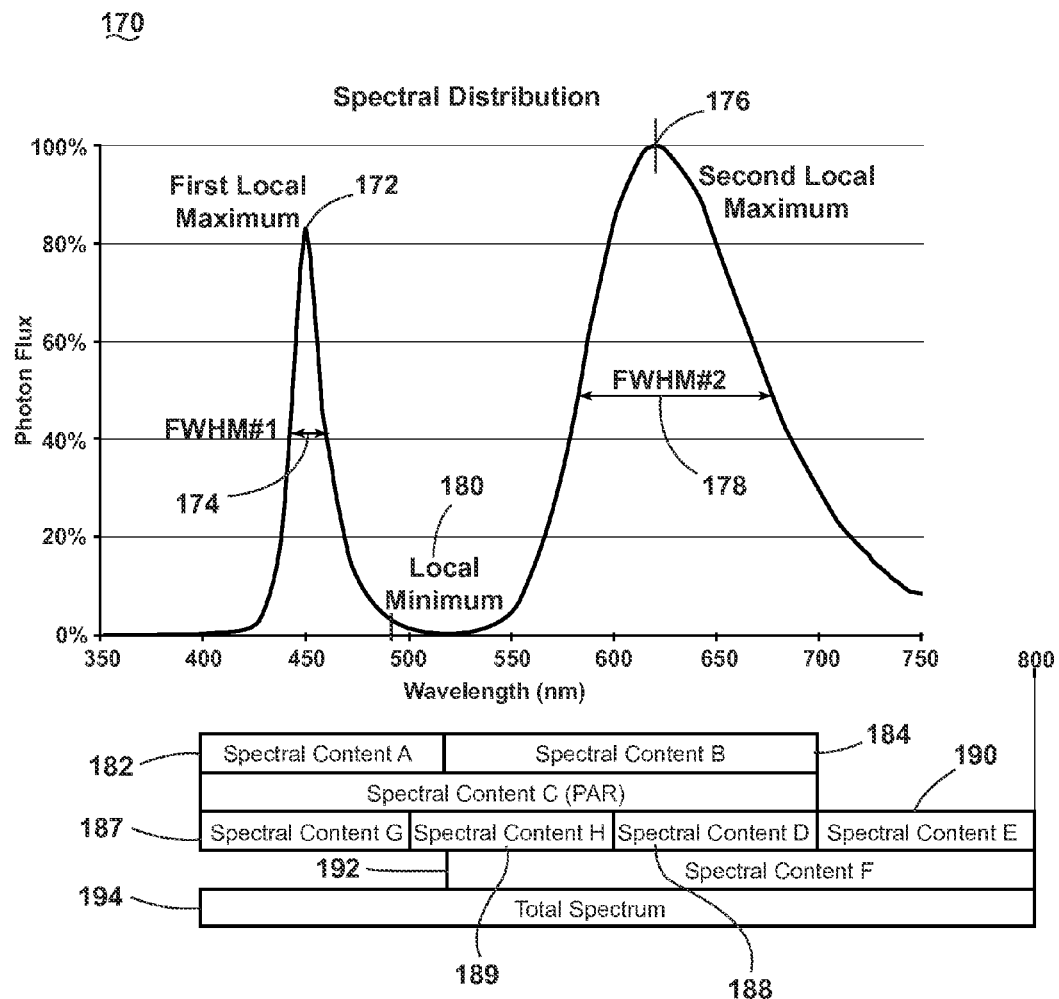
FIG. 12 illustrates a spectral output of a volumetric light emitting device spectrally adapted for illuminating plants.

Referring now to FIG. 12, a distribution 170 of the spectral output of a volumetric light emitting device spectrally adapted for illuminating plants as described in FIG. 11 is shown. The LED light source 110 emits light at a first wavelength 111 where the first wavelength 111 is in a range described by a wavelength at which a local maximum 172 occurs and the wavelength extent of the FWHM 174. That is, each photon of light emitted by the LED light source 110 has a particular wavelength and the set of wavelengths emitted by the LED light source 110 follow a distribution described, in part, by the local maximum 172 and the FWHM 174. The phosphors in the volumetric light conversion element 118 down-converts a portion of the light emitted at a first wavelength 111 to a second wavelength 113 where the second wavelength 113 is in a range described by a wavelength at which a local maximum 176 occurs and the wavelength extent of the FWHM 178. That is, each photon of down-converted light emitted by the phosphors in the volumetric light conversion element 118 has a particular wavelength and the set of wavelengths follow a distribution described, in part, by the local maximum 176 and the FWHM 178. A local minimum 180 is located between the first local maximum 172 and the second local maximum 176.

As used herein, Spectral Content A 182 is defined by the integral of photon flux between 400 nm and the local minimum 180. The distribution of the wavelengths of light emitted by the LED light source 110 approximately covers Spectral Content A 182. However, when using a yellow/green phosphor, the extent in wavelength of the LED emission and the extent in wavelength of the down-converted phosphor emission often overlap. Therefore, Spectral Content A 182 extends to the local minimum 180, which may be located at a shorter wavelength than the longest wavelengths emitted by the LED light source. Similarly, Spectral Content B 184 is defined by the integral of photon flux between the local minimum 180 and 700 nm. The summation of Spectral Content A 182 and Spectral Content B 184 represents PAR (shown as Spectral Content C 186).

With respect to aspects of the visible spectrum, Spectral Content D 188 is defined by the integral of photon flux between 600 nm and 700 nm forming the red region of the spectrum. Spectral Content E 190 is defined by the integral of photon flux between 700 nm and 800 nm forming the far red region of the spectrum (as opposed to the near infrared spectrum commonly defined as the band of wavelengths ranging from 750 nm to 1400 nm). Spectral Content F 192 is defined by the integral of photon flux between the local minimum 180 and 800 nm and includes the second local maximum 176. Consequently, the Total Spectral Content 194 emitted by the spectrally adapted light emitting device may be defined as the sum of Spectral Content A 182 and Spectral Content F 192. Spectral Content G 187 is defined by the integral of photon flux between 400 nm and 500 nm forming the blue region of the spectrum. Spectral Content H 189 is defined by the integral of photon flux between 500 nm and 600 nm and forming the green region of the spectrum.

The spectral location (i.e. wavelengths) of the local maxima 172, 176 is critical to output the type of light from the light emitting device that plants require for growth and health. Some plant processes and functions are wavelength-specific and require careful selection of levels and ratios of different wavelengths of light. For example, phytochrome is a pigment with a ground state that absorbs with a sharp peak between 650 nm and 670 nm, but primarily absorbs between 705 nm and 740 nm after being excited to return to the ground state. The ratio of light in these wavelength ranges determines the ratio of ground state and excited state phytochrome which impacts plant circadian rhythms, seed germination, seedling elongation, chlorophyll synthesis and more. Selecting a local maximum 176 will adjust this ratio and impact these several critical aspects of plant growth. Other similar pigments include phototropin and cryptochromes sensitive to specific shorter wavelengths.

Consequently, the light emitting device may be spectrally adapted for one or more plant functions. For example, the first wavelength may include a first local maximum 172 between 400 nm and 480 nm. Other preferable ranges, decreasing in width for the first local maximum 172 include between 420 nm and 465 nm, 430 nm and 460 nm and 445 nm and 455 nm. The FWHM 174 at the first local maximum 172 may range from 10 to 30 nm, 12 to 25 nm and, preferably, range from 20 nm to 23 nm. The local minimum 180 may range anywhere between the first local maximum 172 and the second local maximum 176. For example, the local minimum may be at or near 495 nm ranging up to at or near 550 nm.

The FWHM 178 at the second local maximum 176 is dependent on both the first wavelength light emitted by the LED light source and the specific phosphor selection and blending in the volumetric light conversion element. The wide FWHM 178, centered around the peak quantum efficiency wavelengths for general plant growth, balances the need for a relatively broad spectrum to support total plant functions with the importance of generating the majority of photons at the most photosynthetically efficient wavelengths. The second wavelength may include a second local maximum between 580 nm and 680 nm. Other preferable ranges, decreasing in width include 590 nm to 660 nm, 600 nm to 640 nm and 615 nm to 625 nm. The FWHM 178 at the second local maximum 176 may range from 60 nm to 120 nm. Preferably, the FWHM 178 at the second local maximum may range from 100 nm to 110 nm, but other ranges may include 40 nm to 150 nm, 70 nm to 130 nm and 85 nm to 120 nm.

The ratio of the Total Spectral Content 194 relative to Spectral Content A 182 may be in the range of 3 to 20. Preferable ranges include 3.3 to 7.3, 4 to 6, and most preferably 5 to 5.75.

Spectral Content G 187 (i.e. the blue content of the spectrum) expressed as the percent of the Total Spectral Content 194 is preferably in the range of 5 to 50 percent. Alternatively, the Spectral Content G 187 output from the spectrally adapted light emitting device may range from 10 to 35 percent, 12 to 25 percent and 17 to 22 percent.

The ratio of Spectral Content D 188 relative to Spectral Content A 182 may be in the range of 2 to 10. The ratio may range from 2.4 to 5.5, 2.4 to 4.5 and, preferably, 2.4 to 3.4.

The percentage of Spectral Content E 190 relative to Spectral Content F 192 is preferably in the range of 0 to 16 percent. The ratio may range from 0 to 14 percent, 4 to 12 percent, and preferably 6 to 9 percent. The balance between Spectral Content E 190 and Spectral Content F 192 is critical due to the aforementioned phytochrome ground state and excited state ratio that influences many aspects of plant growth. In addition, both wavelengths of red light and far red light are more efficient at driving photosynthesis in the presence of both types of light. Photosynthesis has two main sets of steps, photosystem one and photosystem two, that are driven by different wavelengths and operate efficiently when both photosystems are well stimulated (i.e. generating broad spectrum light across Spectral Content F 192).

Stimulation of important pigments in addition to chlorophyll requires breadth and control of the output light spectrum. Anthocyanins, beta-carotene and other carotenoids and pigments, absorb light exclusively or most efficiently between 400 and 500 nm. Though some of these contribute to photosynthesis, the carotenoids and pigments ultimately make blue light less efficient than red light at driving photosynthesis and, therefore, plant growth. Consequently, producing 10 to 25 percent of the light in the 400 nm to 500 nm spectral region generally stimulates healthy, attractive plant growth, while the majority of light output from the light emitting device is in the 580 nm to 700 nm range and is optimal for photosynthetic efficiency.

Green light has far fewer benefits for plants relative to blue and red light. However, research has shown that a small amount of green light may be beneficial to plant growth. A large amount of green light is energetically inefficient and has the potential for negative effects on plants, such as stretching. High pressure sodium, metal halide and many fluorescents emit 50 to 70 percent of their light in the green region which has been proven to cause reductions in growth compared to emitting light in the blue and red regions. However, a properly controlled and distributed amount of green light is valuable. Because green photons are the least efficiently absorbed photons, they have the ability to penetrate through the canopy and provide sustenance to the lower leaves of the plant. Additionally, because the human eye is most sensitive to green light, its presence makes it easier to visually inspect plants for health issues, while creating a more comfortable light for workers. The specific growing application determines the need or lack thereof for the artificial lighting source to provide any significant output in the green region. When there is little or no sunlight available, such as in a fully enclosed grow room or grow factory, or when sunlight is minimal, such as a short and cloudy winter day, there is use for a small amount of green output. Output in the green region of the spectrum may benefit larger plant sizes because of the increased ability of green photons to penetrate to deeper layers of plants. However, when sunlight represents 50 percent or more of the light received by a plant, there is minimal reason to provide supplemental green light rather than blue or red. Therefore, Spectral Content H 189 (i.e. the green content of the output spectrum of the volumetric light emitting device) expressed as a percent of the Total Spectral Content 194 may be in the range of 0 to 50 percent. Other ranges include 1 to 40 percent, 5 to 25 percent, and, preferably, 14 to 18 percent. For a spectrum optimized to work in the absence of or diminutive sunlight, the Spectral Content H 189, expressed as a percent of the Total Spectral Content 194, may be in the range of 1 to 50 percent. Other ranges include 5 to 40 percent, 15 to 30 percent, and, preferably, 21 to 26 percent.

Spectral Content D 188, expressed as the percent of the Total Spectral Content 194 is preferably in the range of 30 to 95 percent. Other ranges include 35 to 80 percent, 40 to 75 percent and, preferably, 45 to 55 percent.

Red light (i.e. 600-700 nm) is primarily and efficiently absorbed by chlorophyll. It is therefore the most efficient part of the spectrum for driving general plant growth when properly supplemented with supporting wavelengths. It is also vital for proper flowering for many plants due to phytochrome activation, enhances leaf expansion and decreases the stem elongation caused by green and especially far red light.

As can be seen above, a volumetric light emitting device may be adapted with a light spectrum optimized for a broad range of plants. Additionally, the volumetric light emitting device may be designed with a light spectrum optimized for a specific plant or group of plants, whereas the light output is characterized by key spectral parameters including local maxima, local minima, spectral contents and FWHMs as described above. For example, a broad spectrum designed for a broad range of plants may have the following characteristics:

First local maximum 172: 460 nm
Second local maximum 176: 610 nm
Local Minimum 180: 520 nm
FWHM #1 174: 17 nm to 20 nm
FWHM #2 178: 80 nm to 85 nm
Ratio of Total Spectral Content 194 relative to Spectral Content A 182: 5.00 to 5.50
Ratio of Spectral Content D 188 to Spectral Content A 182: 3.5 to 4.0
Percentage of Spectral Content E 190 with respect to Spectral Content F 192: 2% to 4%
Percentage of Spectral Content E 190 with respect to Total Spectral Content 194: 1% to 3%
Percentage of Spectral Content A 182 with respect to Total Spectral Content 194: 18% to 20%
Percentage of Spectral Content G 187 with respect to Total Spectral Content 194: 17% to 19%
Percentage of Spectral Content H 189 with respect to Total Spectral Content 194: 12% to 14%

The volumetric light emitting device may also be designed with a light spectrum optimized specifically for daylength control, or photoperiodic, lighting. As previously described, the most critical trigger in plants for circadian rhythms, especially short-day and long-day triggers including flowering, is phytochrome absorption. Phytochrome absorption is a critical light-mediated trigger that causes a plant to function based on long or short days depending on the daily cycle of receiving or not receiving certain wavelengths. Deficiencies in either red or far red light, which trigger Pfr and Pr states of phytochrome, respectively, reduce the likelihood and efficiency of effective photoperiodic lighting. The most effective ratio of Pr-:Pfr-absorbed light is in the range of 0.5 to 2.0. Traditional lighting options output this range of ratios only with inefficient and short-lived incandescent lighting. In addition, if it results in a predominantly far red light that is deficient in blue and red light, the Pr:Pfr light ratio may trigger shade avoidance mechanisms that cause undesirable stretching in plants.

The far red light that is vital for photoperiodic lighting and important for general-purpose grow lighting can be most efficiently and economically generated by the described volumetric light emitter technology. As shown previously, standard high pressure sodium, metal halide and fluorescent lamps produce very minimal far red light. Incandescent lamps produce large quantities of far red but with very low electrical efficiency and with the smallest lifetimes. LEDs can produce pure far red light, but at an inefficient fraction of the efficiency with which an LED can be used to produce blue or red light. The directional output of LEDs is also a disadvantage here due to the low light intensities required for photoperiodic lighting that can be achieved more efficiently with a more omni-directional output pattern for improved uniformity potential. Using phosphor to down-convert blue LED light to the proper far red spectrum is the best solution. However, this process has a very large Stokes shift and requires less reliable phosphors than with white light generation. As a result, a volumetric light emitter designed with enhanced heat dissipation techniques allows the far red light to be generated both efficiently and reliably in a manner unattainable by other technologies.

Figure 13:
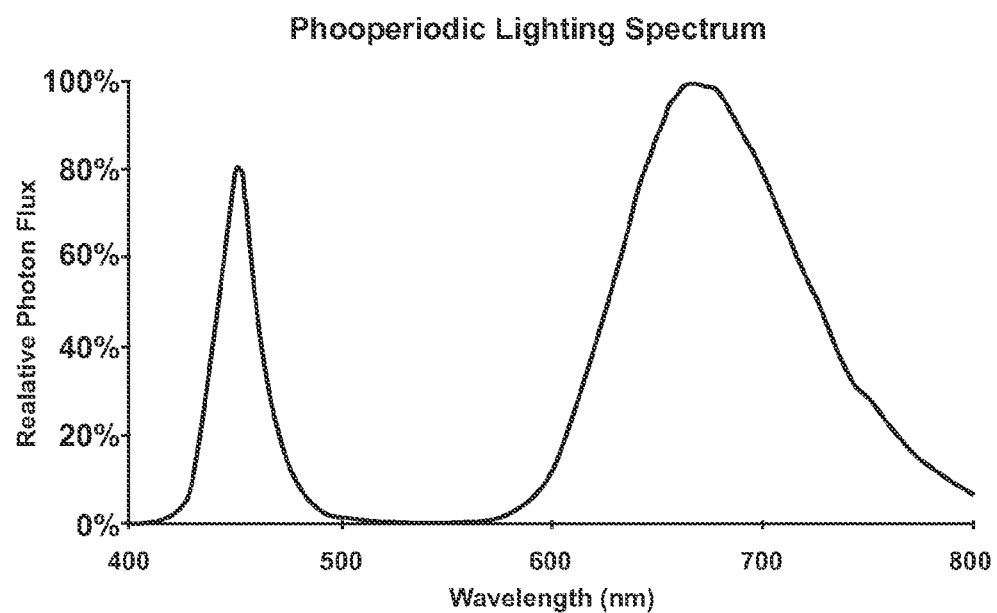
FIG. 13 illustrates a spectral output of a volumetric light emitting device spectrally adapted for illuminating plants with a photoperiodic lighting spectrum.

Referring now to FIG. 13, the light output of the volumetric light emitting device adapted to output a photoperiodic lighting spectrum is shown. The first local maximum and FWHM in the blue region of the spectrum provide stimulation of the photoreceptors sensitive to blue photons that stimulates the generally desirable photomorphogenic responses caused by blue light that are lacking under other lights like incandescent and high pressure sodium. The second local maximum and FWHM in the red and far red regions balance the Pr and Pfr absorption curves in a ratio of about 1.5:1, effecting photoperiodic lighting while providing sufficiently more red light than far red to minimize shade avoidance responses. For photoperiodic lighting, green light (i.e. 500 to 600 nm light) has little to no utility and is kept at a minimum for this application. The output of the volumetric light emitting device may include a green portion to enhance the luminous output, if it is beneficial to provide lighting for workers. With reference to the enumerated spectral regions in FIG. 12, the output spectrum of which the plot in FIG. 13 is an example, may include the following characteristics:

First local maximum 172: 450 nm
Second local maximum 176: 668 nm
Local minimum 180: 540 nm
FWHM#1 174: 20 nm to 23 nm
FWHM#2 178: 95 nm to 105
Ratio of Total Spectral Content 194 relative to Spectral Content A 182: 5.5-6.5
Percentage of Spectral Content G 187 relative to the Total Spectral Content 194: 15-20%
Percentage of Spectral Content E 190 relative to Spectral Content F 192: 30-35%
Percentage of Spectral Content E 190 relative to the Total Spectral Content 194: 22-30%
Percentage of Spectral Content A 182 relative to the Total Spectral Content 194: 15-20%
Percentage of Spectral Content H 189 relative to the Total Spectral Content 194: 0-4%
Percentage of Spectral Content D 188 relative to the Total Spectral Content 194: 50-60%

Figure 14:
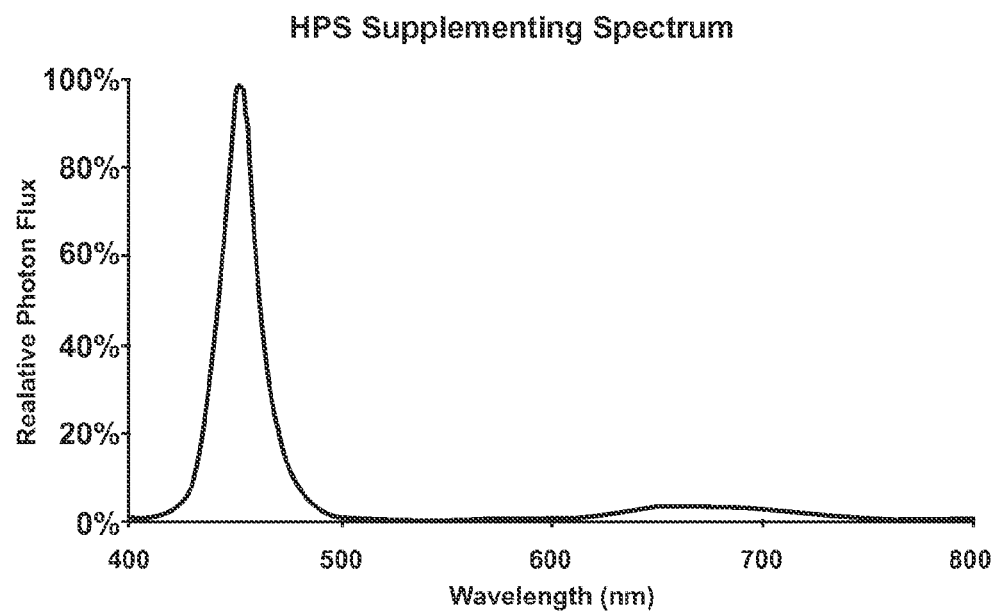
FIG. 14 illustrates a spectral output of a volumetric light emitting device spectrally adapted for illuminating plants by supplementing a high pressure sodium bulb.

Referring now to FIG. 14, the light output of the volumetric light emitting device adapted to supplement the light output of a high pressure sodium bulb is shown. A volumetric light emitter may be designed with a light spectrum optimized specifically for supplementing the spectrum of high pressure sodium bulbs. As previously described, high pressure sodium bulbs emit most of their output light in the green, yellow and orange region of the spectrum. High pressure sodium bulbs are inefficient at driving general growth in comparison to an optimized spectrum, but the inefficiencies are generally overcome when supplied with extra light intensity. This compensation applies more easily to fulfill the photosynthetic power of red photons than the photomorphogenic and enhancement effects of blue and far red photons. Therefore, a volumetric light emitting device may specifically provide the portions of an optimized broad growth spectrum that are most deficient in the high pressure sodium spectrum. With reference to the enumerated spectral regions in FIG. 12, the output spectrum of which the plot in FIG. 14 is an example, may include the following characteristics:

First local maximum 172: 450 nm
Second local maximum 176: 668 nm
Local Minimum 180: 540 nm
FWHM#1 174: 20-23 nm
FWHM#2 178: 95-105 nm
Ratio of the Total Spectral Content 194 relative to Spectral Content A 182: 1.12-1.19.
Percentage of Spectral Content G 187 relative to the Total Spectral Content 194: 85-90%.
Percentage of Spectral Content E 190 relative to Spectral Content F 192: 30-35%.
Percentage of Spectral Content E 190 relative to the Total Spectral Content 194: 3-6%.
The percentage of Spectral Content A 182 relative to the Total Spectral Content 194: 85-90%.
The percentage of Spectral Content H 189 relative to the Total Spectral Content 194: 0-4%.
The percentage of Spectral Content D 188 relative to the Total Spectral Content 194: 6-11%.

As described above, the light emitting device, by way of the geometry and reflectivity properties of the reflectors, the type and mix of the phosphors in the volumetric conversion element and the dispersal of scattering material in and on the reflective elements and the volumetric conversion elements, dictates the spectral distribution of the output light distribution. Additional embodiments of the light emitting device will include these elements and not be considered limiting. Instead, the descriptions herein of additional embodiments of the light emitting device further demonstrate aspects of the light emitting device and features useful in developing lighting technology for the benefit of plant growth applications.

Figure 15:
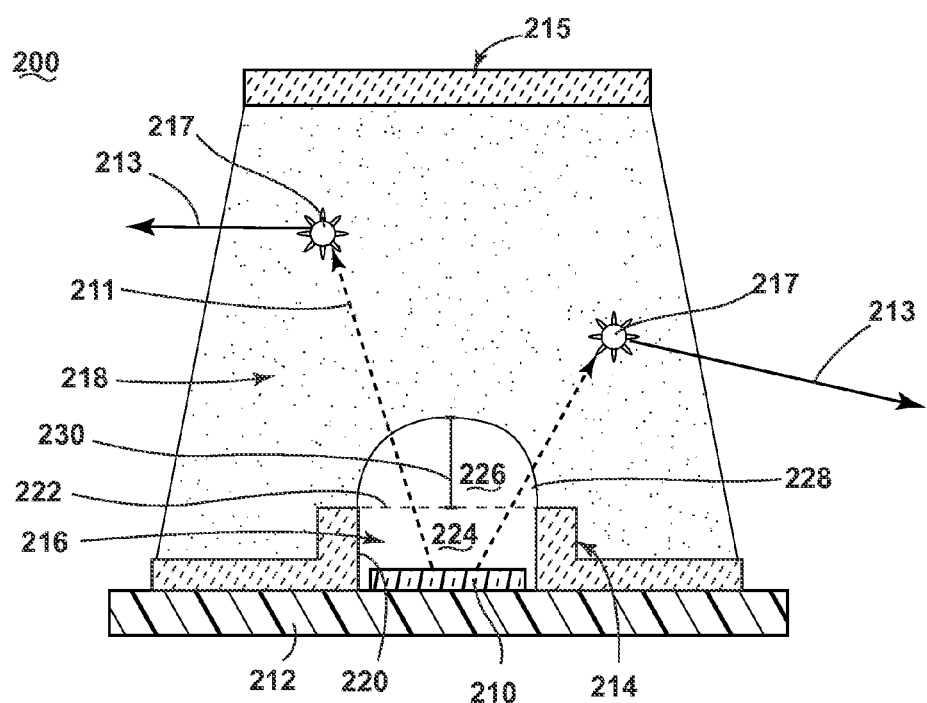
FIG. 15 illustrates a cross-sectional view of a volumetric light emitting device with a hemispherical encapsulant.

FIG. 15 illustrates an alternative volumetric light emitting device 200 according to a second embodiment of the invention. The second and subsequent embodiments may be similar to the first embodiment; therefore, like parts will be identified with like numerals increased by 100, with it being understood that the description of the like parts of the first embodiment applies to the second and subsequent embodiments, unless otherwise noted. A difference between the first embodiment and the second embodiment may be that the second volume 226 may be arranged in a hemispherical configuration, instead of the substantially domed configuration of the first embodiment. Expanding upon the example set forth above, by adding the second volume 226 of encapsulant 216 in the shape of a hemisphere with a height 230 of 4.45 mm above the reflector ring 214 with a diameter of 8.89 mm, the surface area of the interface 228 increases to 124.4 mm$^2$; an increase of approximately 100 percent.

Figure 16:
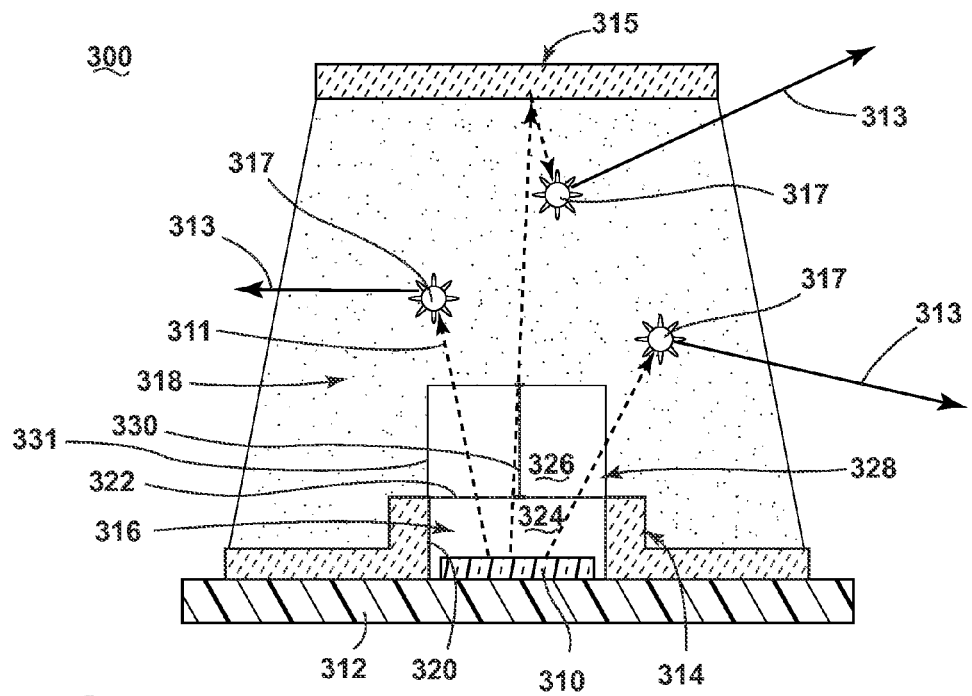
FIG. 16 illustrates a cross-sectional view of a volumetric light emitting device with a cylindrical encapsulant.

FIG. 16 illustrates an alternative volumetric light emitting device 300 according to a third embodiment of the invention. A difference between the first embodiment and the third embodiment may be that the second volume 326 may be arranged in a cylindrical configuration. Expanding again upon the example set forth above, by adding a second volume 326 of encapsulant 316 in the shape of a cylinder with a height 330 of 6 mm above the reflector ring 314 with a diameter of 8.89 mm, the surface area of the interface 328 includes the 62.2 mm$^2$ for the circular base area 329 at the top of the cylinder and the 167.7 mm$^2$ for the lateral area 331 for a total area of 229.9 mm$^2$; an increase of 269 percent.

Figure 17:
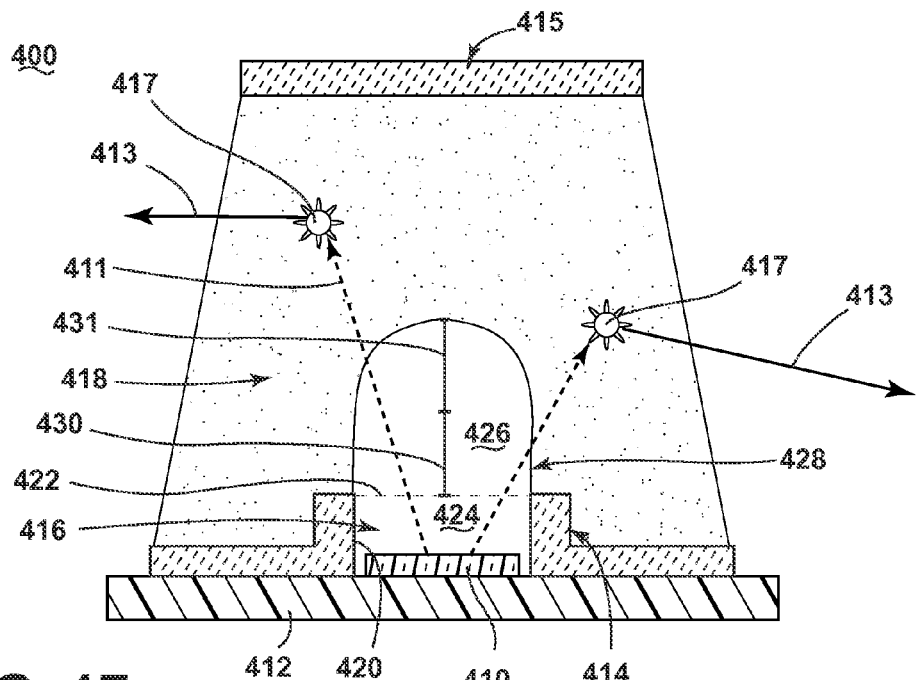
FIG. 17 illustrates a cross-sectional view of a volumetric light emitting device with a spherocylindrical encapsulant.

FIG. 17 illustrates another alternative volumetric light emitting device 400 according to a fourth embodiment of the invention. The second volume 426 may formed as a composite solid that is a combination of more than one geometrical shape. As shown, the second volume 426 may be arranged as a combination of a cylinder and hemisphere (i.e. a truncated spherocylinder or capsule). Expanding again upon the example set forth above, by adding a second volume 426 of encapsulant 416 in the shape of a cylinder with a height 430 of 6 mm above the reflector ring 414 with a diameter of 8.89 mm, combined with a hemisphere with a height 431 of 4.45 mm above the upper base of the cylinder, the surface area of the interface 428 increases to approximately 292.0 mm$^2$; an increase of 370 percent.

Figure 18:
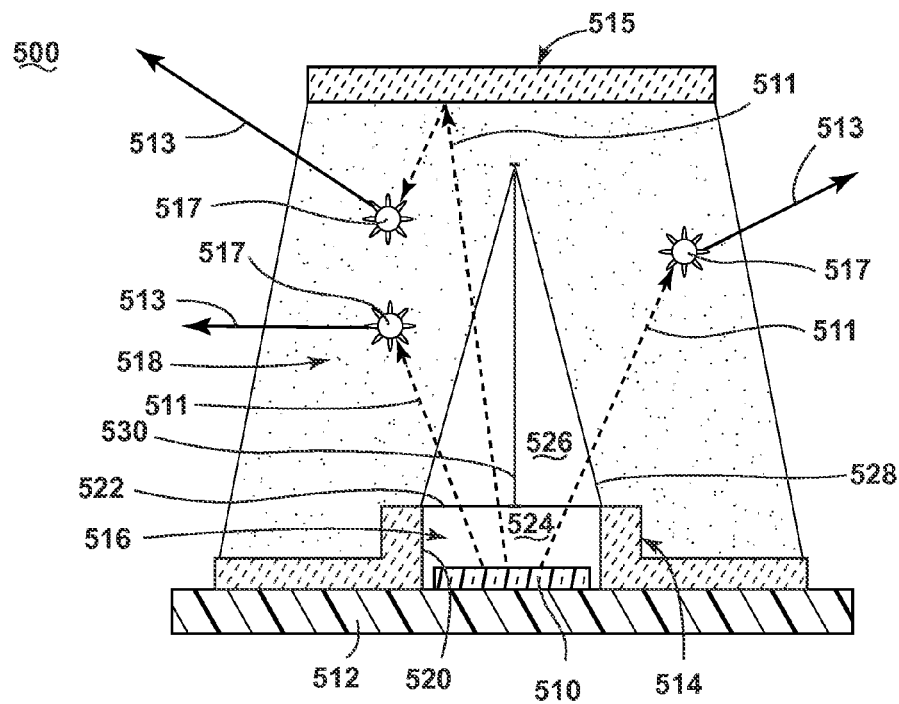
FIG. 18 illustrates a cross-sectional view of a volumetric light emitting device with a conic encapsulant.

FIG. 18 illustrates another alternative volumetric light emitting device 500 according to a fifth embodiment of the invention. The second volume 526 may be arranged in a conical configuration. As shown, continuing with the example set forth above, by adding the second volume 526 of encapsulant 516 in the shape of a cone with a height 530 of 15 mm above the reflector ring 514 with a diameter of 8.89 mm, the surface area of the interface 528 increases to 218.6 mm$^2$; an increase of approximately 152 percent.

Figure 19:
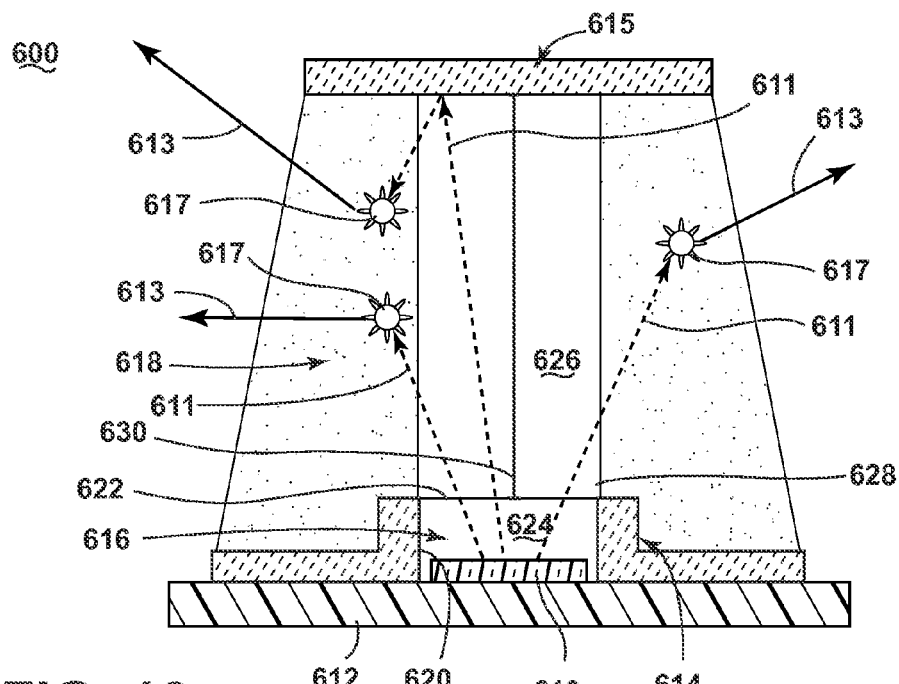
FIG. 19 illustrates a cross-sectional view of a volumetric light emitting device with an extended cylindrical encapsulant.

FIG. 19 illustrates another alternative volumetric light emitting device 600 according to a sixth embodiment of the invention. The dimensions and relative geometry of the second volume 626 with respect to other elements of the volumetric light emitting device 600 may be varied and preferably selected according to the particular design requirements of the lighting device without loss of generality. As previously described in FIG. 16, the second volume may be arranged in a cylindrical configuration. However, the cylinder may be configured to extend to the top reflector 615 whereby the surface area of interface 628 is determined by the lateral surface area of the cylinder. For example, by adding a second volume 626 of encapsulant 616 in the shape of a cylinder extending to the upper reflector 615 with a diameter of 8.89 mm, with a height 630 of 20 mm above the reflector ring 614, the surface area of the interface 628 increases to 558.9 mm$^2$; an increase of approximately 699 percent.

As shown in FIGS. 11 and 15 through 19, there are many ways to configure the second volume to increase the surface area at the interface between the encapsulant and the phosphor particles dispersed in a resin, thereby minimizing the potential for concentrated heat buildup from the heat of down-conversion at a localized hot spot. The second volume may be configured in geometrical shapes including, but not limited to, a dome, hemisphere, cylinder, cone, paraboloid, or a combination thereof. These secondary volumes generally both increase heat dissipation by generating the heat closer to the surface of the whole volume and decrease maximum temperatures by dispersing the down-conversions over a wider area and larger volume.

As the light of a first wavelength (e.g. blue light) emitted by the LED light source propagates through the encapsulant, the encapsulant may absorb some amount of the emitted light, having the effect of building up heat and reducing the output of down-converted light of a second wavelength from the volumetric light emitting device. Consequently, minimizing the distance traveled by the emitted light through the encapsulant maximizes the potential light output from the volumetric light emitting device and minimizes heat buildup. The addition of reflective surfaces or scattering material in the second volume to reflect or otherwise redirect the emitted light into the phosphor particle dispersed in the volumetric light conversion element, in part, minimizes the distance. In this way, the upper reflector may include one or more elements extending axially into the volumetric light conversion element. To enable the formation of the upper reflector elements to extend axially into the volumetric light conversion element, the upper reflector may be formed of a highly reflective thermal plastic material that is readily molded into a desired shape. One material that is contemplated for the formation of the upper reflector is titanium dioxide (TiO$_2$) though other materials may be used, singly or in combination, for example, polished aluminum.

Figure 20:
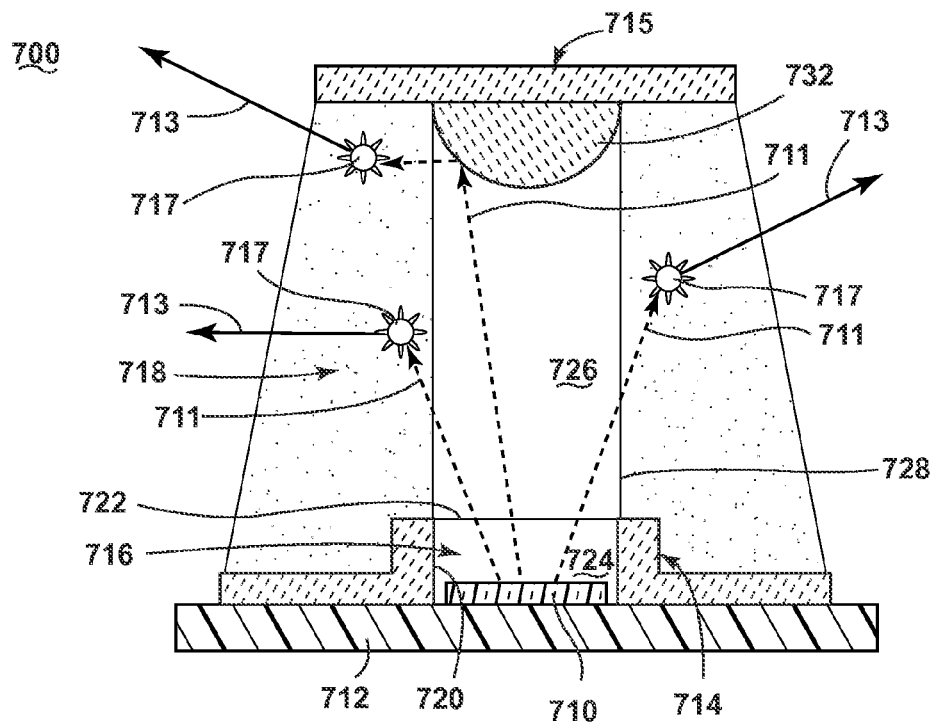
FIG. 20 illustrates a cross-sectional view of a volumetric light emitting device with a dome reflector element extending axially into the encapsulant.
Figure 21:
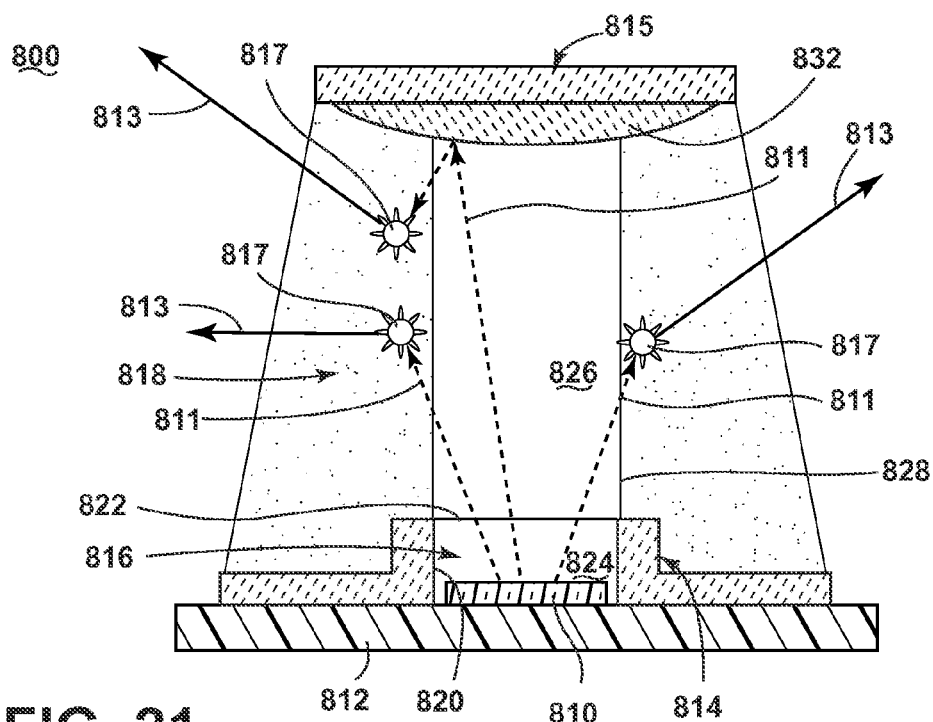
FIG. 21 illustrates a cross-sectional view of a volumetric light emitting device with a dome reflector element extending axially into the encapsulant and the volumetric light conversion element.
Figure 22:
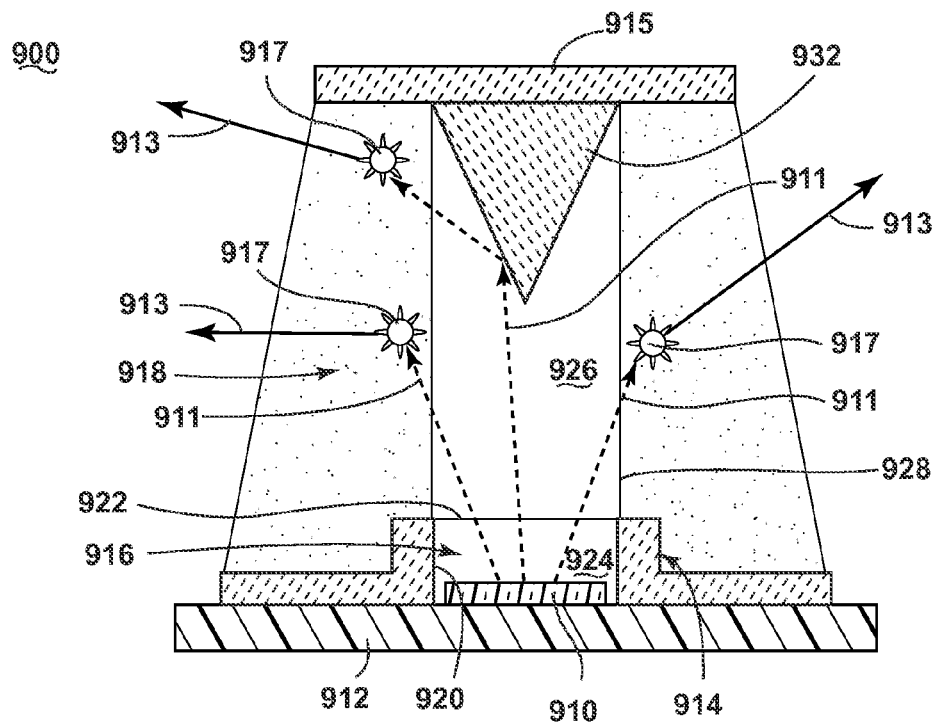
FIG. 22 illustrates a cross-sectional view of a volumetric light emitting device with a conic reflector element extending axially into the encapsulant.
Figure 23:
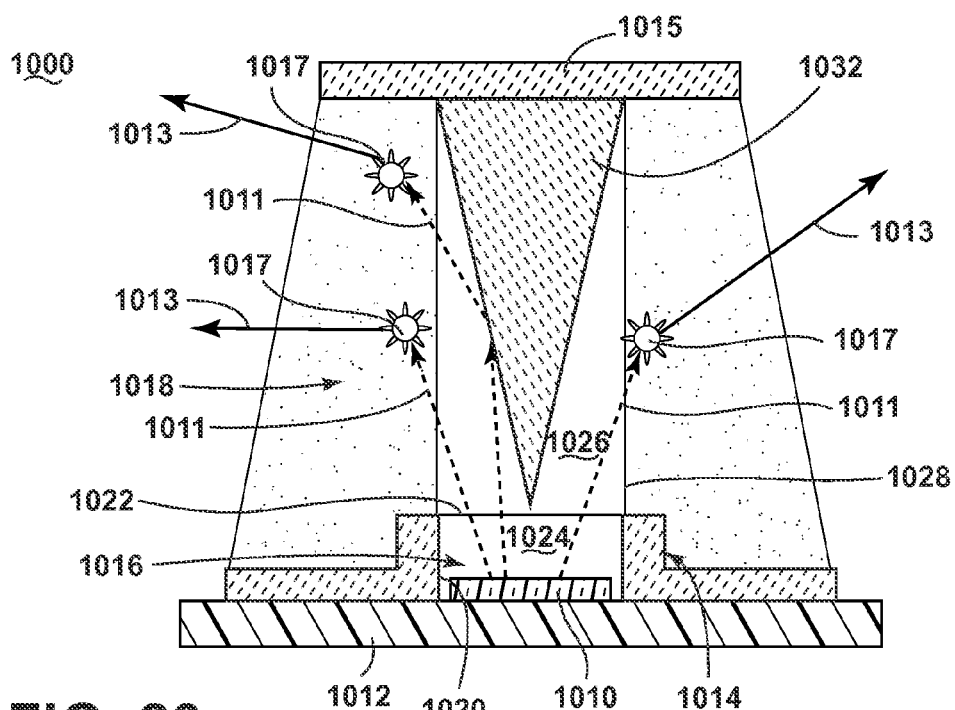
FIG. 23 illustrates a cross-sectional view of a volumetric light emitting device with an extended conic reflector element extending axially into the encapsulant.
Figure 24:
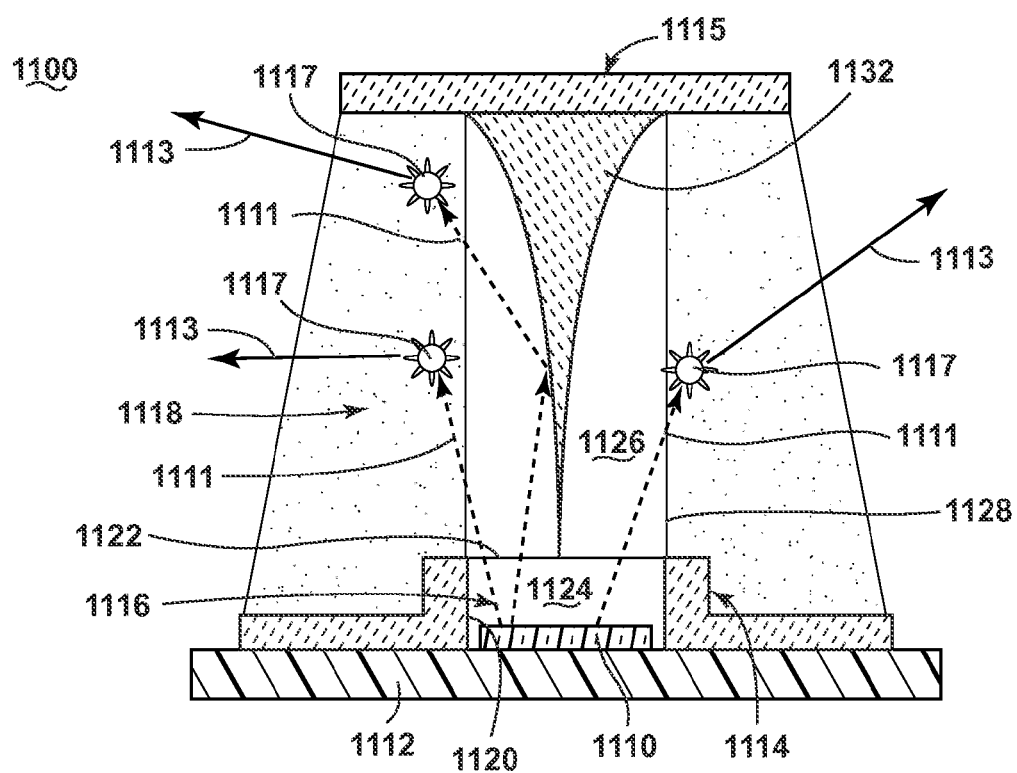
FIG. 24 illustrates a cross-sectional view of a volumetric light emitting device with a funnel shaped reflector element extending axially into the encapsulant.

FIG. 20 through FIG. 24 illustrate examples of volumetric light emitting devices similar to that illustrated in FIG. 19 where the upper reflector contains elements that extend downward into the encapsulant material where the encapsulant is formed as a cylinder. FIG. 20 illustrates a cross-sectional view of a volumetric light emitting device 700 with a dome reflector element 732 extending axially into the encapsulant 726. FIG. 21 illustrates a cross-sectional view of a volumetric light emitting device 800 with a dome reflector element 832 extending axially into the encapsulant 826 and the volumetric light conversion element 818. FIG. 22 illustrates a cross-sectional view of a volumetric light emitting device 900 with a conic reflector element 932 extending axially into the encapsulant 926. FIG. 23 illustrates a cross-sectional view of a volumetric light emitting device 1000 with an extended conic reflector element 1032 extending axially into the encapsulant 1026. FIG. 24 illustrates a cross-sectional view of a volumetric light emitting device 1100 with a funnel-shaped reflector element 1132 extending axially into the encapsulant 1126.

Figure 25:
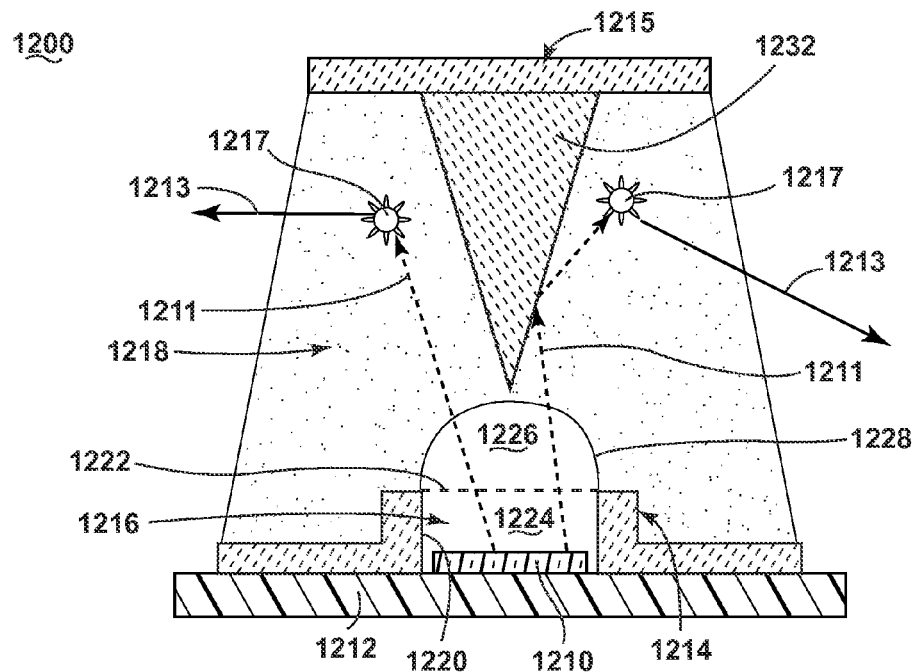
FIG. 25 illustrates a cross-sectional view of a volumetric light emitting device with a conic reflector element extending axially into the volumetric light conversion element.

The upper reflector may contain downward extending elements without the limitation of extending into the encapsulant. For example, as shown in FIG. 25 which illustrates a volumetric light emitting device 1200 similar to that illustrated in FIG. 15, elements of the upper reflector 1232 may extend into the phosphor particles 1218 dispersed in resin and not into the encapsulant 1226. FIG. 25 illustrates a cross-sectional view of a volumetric light emitting device 1200 with a conic upper reflector element 1232 extending axially into the volumetric light conversion element 1218. By forming the upper reflector with elements extending axially into the volumetric light conversion element 1218, heat generated from down-conversions transfers further away from the center of the volumetric light conversion element 1218 to the outer walls where it may more quickly dissipate.

Much of the heat dissipated from the volumetric light conversion element occurs through the exterior surface via convection, conduction or radiation to the surrounding air. As the amount of heat dissipated through convection, conduction or radiation is directly proportional to the exterior surface area of the volumetric light conversion element, increasing the external surface area of the volumetric light emitting device may dissipate more heat, or dissipate heat more quickly, thereby maintaining a cooler temperature inside the volume. Increasing the exterior surface area may be accomplished with the addition of ribs, waves or other geometry for increasing surface area of the light conversion element or the reflectors or any area for the dissipation of heat.

Figure 26:
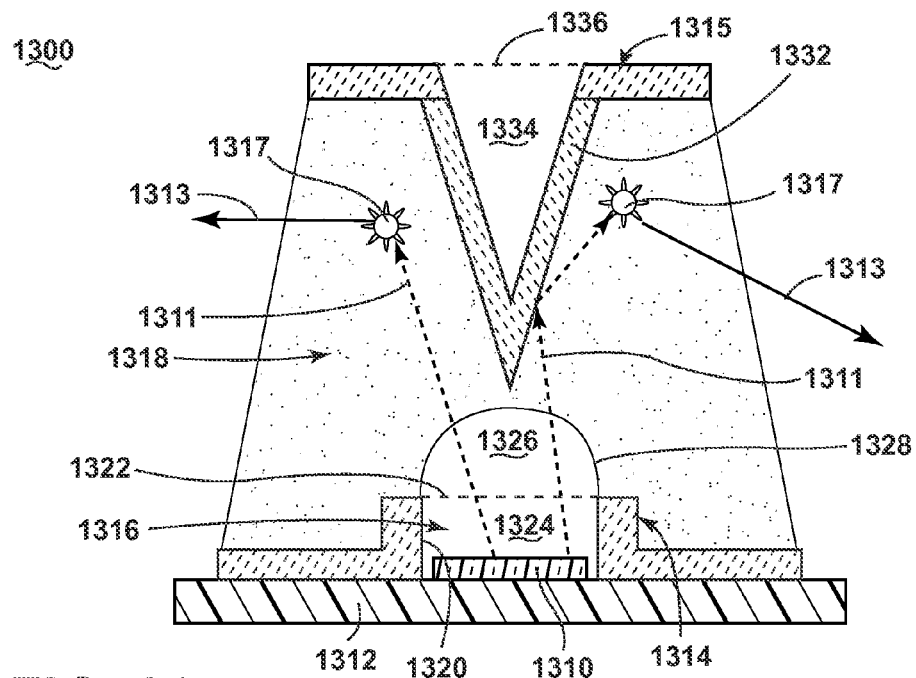
FIG. 26 illustrates a cross-sectional view of a volumetric light emitting device with a conic reflector element with increased exterior surface area extending axially into the volumetric light conversion element.

Referring now to FIG. 26, a volumetric light emitting device 1300 similar to that illustrated in FIG. 25 may include a downward extending upper reflector 1315, where the upper reflector 1315 is formed with a thin wall and an air cavity 1334 that extends downward along with an upper reflector element 1332 beyond a perimeter 1336 into the volumetric light emitting device 1300. In this way, the upper reflector 1315 forms more surface area to aid in heat dissipation and reduces the path of travel for light from the center of the LED light source 1310 to the exterior surface of the volumetric light emitting device 1300.

Figure 27:
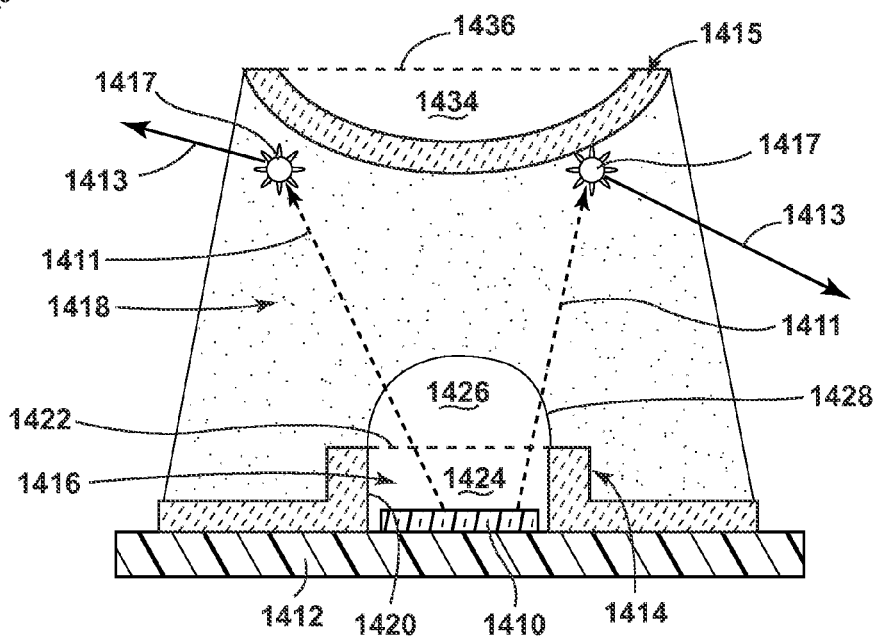
FIG. 27 illustrates a cross-sectional view of a volumetric light emitting device with a hemispherical reflector element with increased exterior surface area extending axially into the volumetric light conversion element.

Other variations of the configuration of the upper reflector are contemplated and include reflector elements shaped as a dome, a hemisphere, a cone, a cylinder, a frustoconical shape, or any combination thereof. The upper reflector may include elements extending axially into the second volume, the volumetric light conversion elements or both. For example, FIG. 27 illustrates a cross-sectional view of a volumetric light emitting device 1400 with a hemispherical upper reflector element 1415 with increased exterior surface area extending axially into the volumetric light conversion element.

Figure 28:
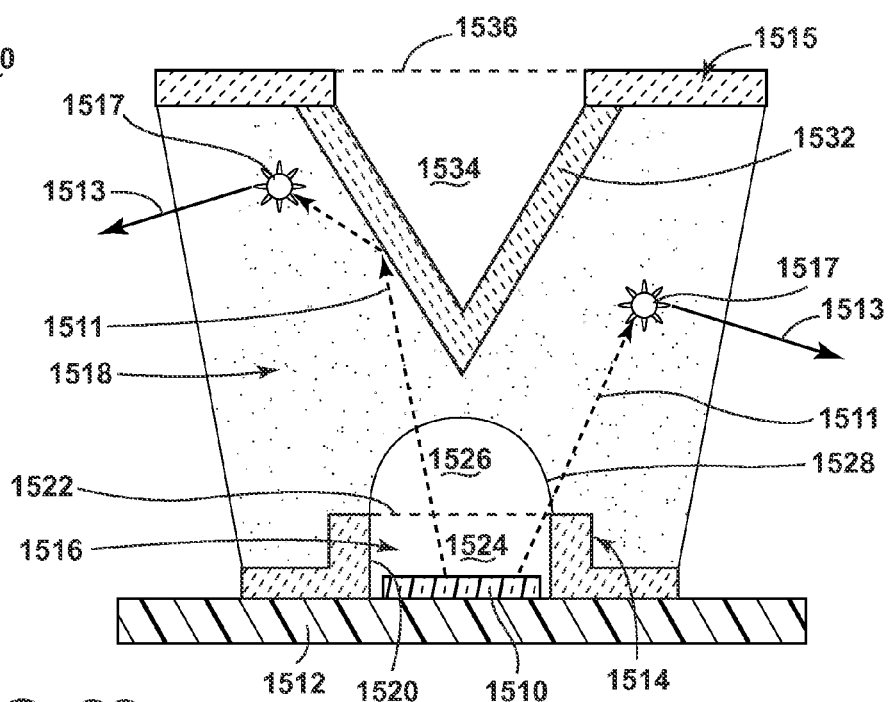
FIG. 28 illustrates a cross-sectional view of a volumetric light emitting device with a conic reflector element extending axially into the volumetric light conversion element where the diameter of the upper portion of the volumetric light conversion element is greater than the diameter of the lower portion.
Figure 29:
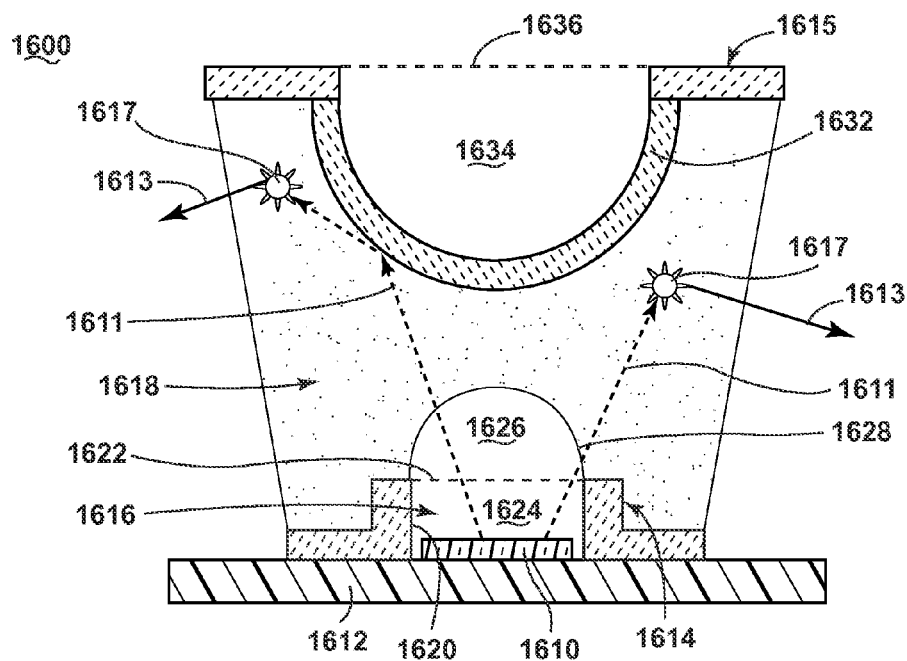
FIG. 29 illustrates a cross-sectional view of a volumetric light emitting device with a hemispherical reflector element extending axially into the volumetric light conversion element where the diameter of the upper portion of the volumetric light conversion element is greater than the diameter of the lower portion.

While volumetric light conversion elements previously illustrated show a larger diameter near the lower reflector ring and a smaller diameter near the upper reflector, the volumetric light emitting device may include a volumetric light conversion element in which the diameter is larger near the upper reflector than the lower reflector ring. FIG. 28 illustrates a cross-sectional view of a volumetric light emitting device 1500 with an upper reflector 1515 that includes a conic reflector element 1532 extending axially into the volumetric light conversion element 1518 where the diameter of the upper portion of the volumetric light conversion element is greater than the diameter of the lower portion. FIG. 29 illustrates a cross-sectional view of a volumetric light emitting device 1600 with an upper reflector 1615 that includes a hemispherical reflector element 1632 extending axially into the volumetric light conversion element 1618 where the diameter of the upper portion of the volumetric light conversion element is greater than the diameter of the lower portion. The configuration of the volumetric light conversion elements 1518, 1618 enable a larger and deeper downward extending cavity in the upper reflectors 1515, 1615 that further increases the exterior surface area of the volumetric light emitting devices 1500, 1600 and creates a shorter path from the center of the LED light sources 1510, 1610 to the respective exterior surface to minimize heat build up and enhance heat dissipation. In this way, the ratio of lower diameter to upper diameter of the volumetric light conversion element may be 0.75:1 but may range from 0.5:1 to 1.0:1, though other ratios may be considered.

The additional surface area of the upper reflector and the larger diameter of the upper portion of the volumetric light conversion element with respect to the diameter of the lower portion may affect the distribution of the light output from the volumetric light emitting device. For example, a volumetric light conversion element with a larger diameter upper portion may minimize the opportunity for the first wavelength light (e.g. blue light emitted from an LED light source) to output from volumetric light conversion element before exciting a phosphor and down-converting light of a second wavelength. Consequently, the upper reflector may be formed with less scattering material than the lower reflector ring to adjust the reflectivity and transmission of light reflected from the upper reflector. Decreasing the scattering material applied in the formation of the upper reflector may allow more light transmission through the upper reflector and decrease light reflection back into the volumetric light emitting device.

In general, making the reflectivity of the upper reflector less than that of the lower reflector ring may benefit the volumetric light emitting device to control the light distribution pattern, particularly in the upward direction where much of the light is often blocked by the upper reflector. With certain reflective materials, the lower reflector ring may have a reflectivity up to approximately 97 percent. The reflectivity of the top reflector can be reduced thereby increasing the light transmission through the top reflector. The transmission of the upper reflector may be increased depending on the desired light output pattern. In this way, controlling the amount of scattering material applied to the upper reflector elements may increase the transmission from 1 percent to 10 percent or from 10 percent to 50 percent. The scattering material may be made of generally reflective materials such as $TiO_2$, quantum dots, or nano-particles.

Figure 30:
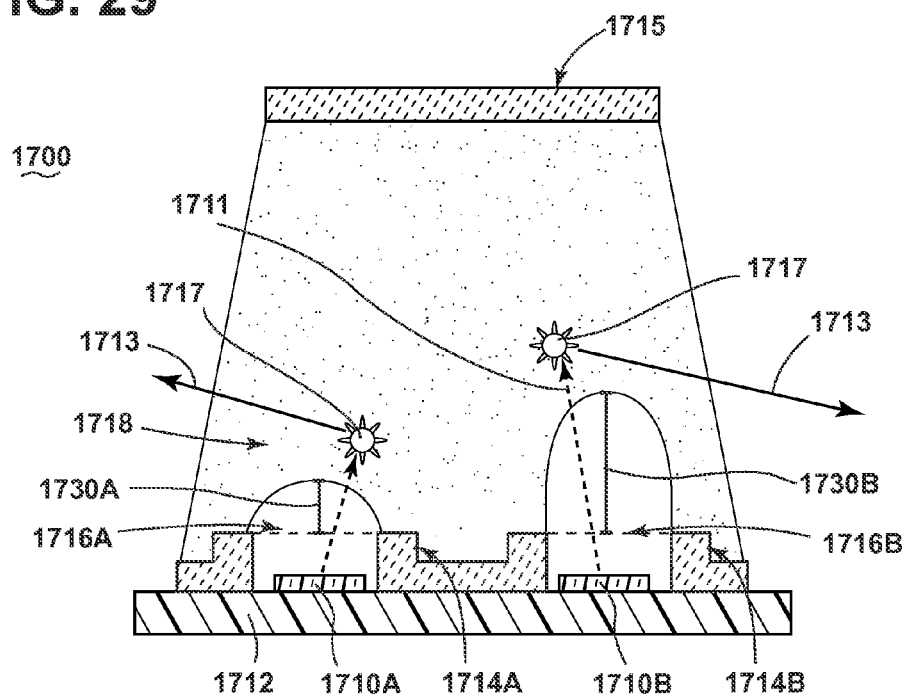
FIG. 30 illustrates a volumetric light emitting device with multiple LEDs spaced concentrically.

FIG. 30 illustrates a volumetric light emitting device 1700 with multiple semiconductor LED light sources 1710A, 1710B arranged concentrically on the substrate 1712. By implementing multiple LED light sources 1710A, 1710B at independent locations, the emitted light of the first wavelength (e.g. blue light) may be distributed over a larger area, thus minimizing heat concentration due to down-conversion and locating a majority of down-converted light closer to the exterior surface of the volumetric light conversion element 1718. Each of the LED light sources 1710A, 1710B may have a corresponding reflector ring 1714A, 1714B and encapsulant 1716A, 1716B. Furthermore, the configuration including dimensions such as height 1730A, 1730B of the encapsulants 1716A and 1716B may differ to optimize or distribute the areas of heat concentration due to down-conversion and optimize light distribution.

Figure 31:
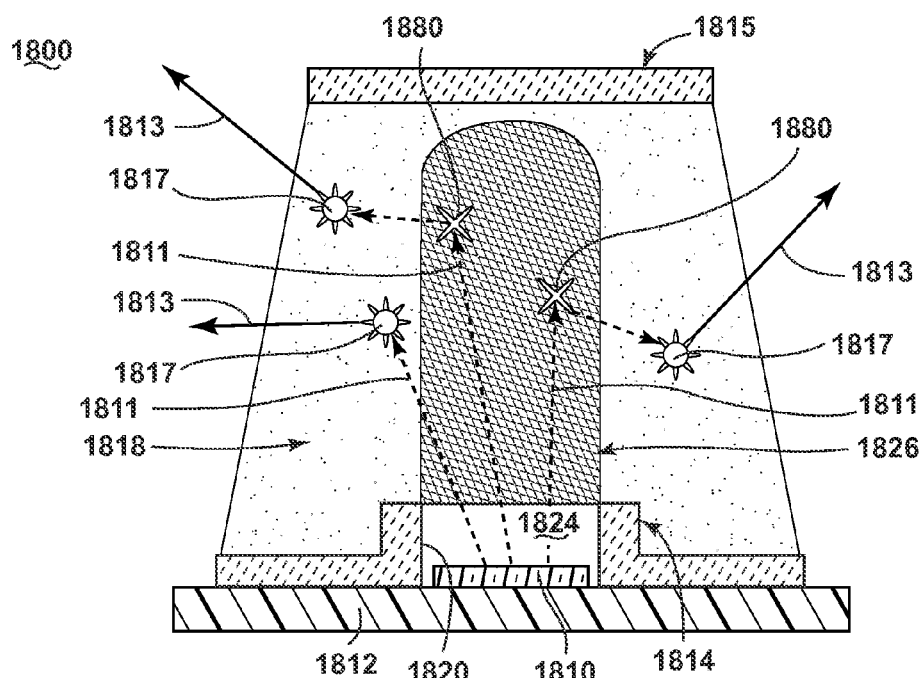
FIG. 31 is a representative illustration of a volumetric light emitting device with scattering material according to an embodiment.

Referring now to FIG. 31, a representative illustration of a volumetric light emitting device 1800 with scattering material in a second volume 1826 is shown. To disrupt the directional nature of the blue light emitted from the LED light source 1810 and distribute the light throughout the phosphors 1817 dispersed in the resin of the volumetric light conversion element 1818, the second volume 1826, formed as any of the shapes discussed above in FIGS. 11 and 15 through 19, may include scattering material such as $TiO_2$. As shown, light of a first wavelength 1811 emitted from the light source 1810 may contact the scattering material 1880 and be redirected to a phosphor 1817 in the volumetric light conversion element 1818 where down-conversion occurs and light of a second wavelength 1813 transmits out of the volumetric light emitting device 1800. The scattering material 1880 may be uniformly distributed or distributed in a gradient with the lowest density adjacent the first volume 1824, increasing to a higher density as the second volume 1826 approaches the upper reflector 1815. The scattering material may be made of generally reflective materials such as $TiO_2$, quantum dots, or nano-particles, or may simply comprise small voids or bubbles in the encapsulant or resin materials that may cause the impinging rays of light to change direction when passing through.

Figure 32:
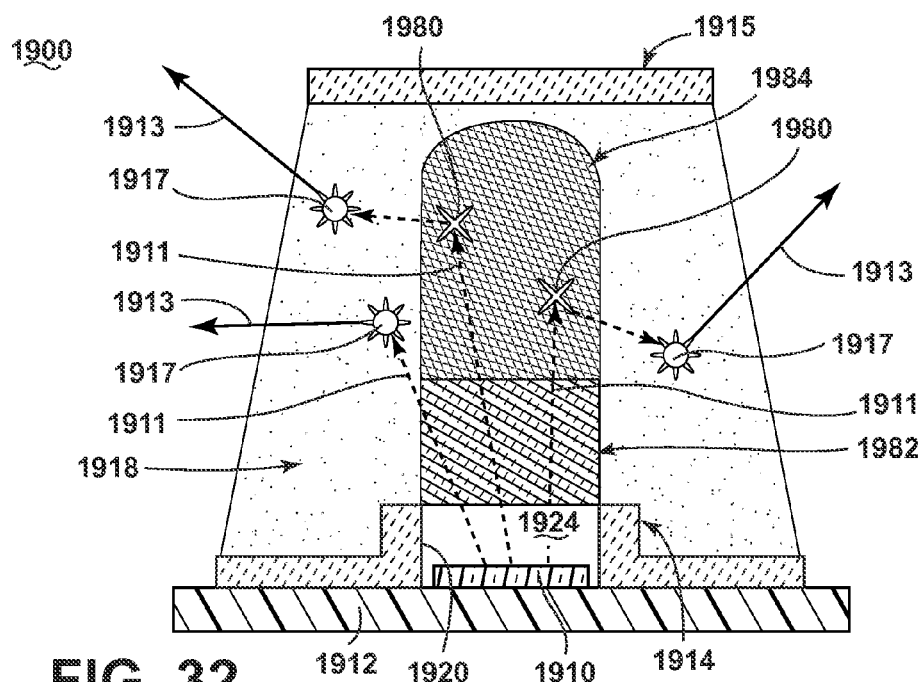
FIG. 32 illustrates a first volume of scattering material with a lower density mix and a second volume of scattering material with a higher density mix.

Referring now to FIG. 32, a representative illustration of a volumetric light emitting device 1900 with layers of scattering material is shown. The scattering material 1980 is distributed in a first volume 1982 with a lower density mix and a second volume 1984 with a higher density mix. An alternative to applying the scattering material in a gradient density, multiple levels of scattering material in an encapsulant may be provided. The density of scattering material in each layer may determine the level of scattering to optimize the blue light distribution and manage the phosphor excitation of the phosphor particles dispersed in resin.

Light may also be directed or scattered using materials formed with designed geometries and selected indices of refraction. Snell's law characterizes the reflection and refraction of light when impinging on an interface between two volumes of differing indices of refraction. For example, the second volume may have a first index of refraction and the volumetric light conversion element may have a second index of refraction that is different than the first index of refraction. Depending on the index of refraction of the different materials, and the geometry of the interface between them, light may be directed or scattered in ways desirable to optimize the light output from the volumetric light emitting device. Implementing different materials with selected refractive indexes can distribute light to provide a more homogeneous distribution of phosphor excitation and more optimally distribute the heat generated from down-conversion from a first wavelength to a second wavelength.

Figure 33:
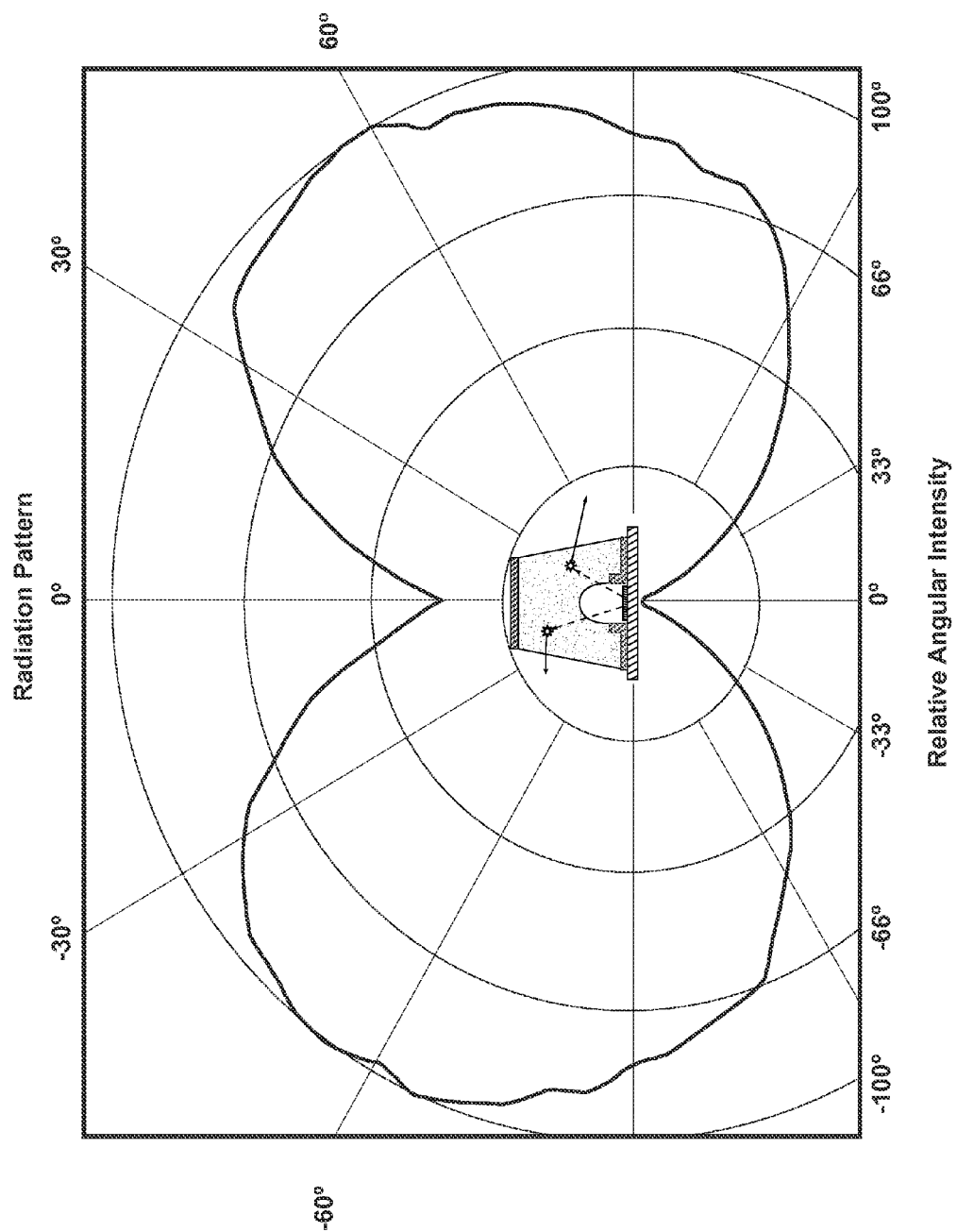
FIG. 33 illustrates the relative angular intensity of the light output of the omni-directional light emitting device.

Referring now to FIG. 33, the relative angular intensity of a light emitting device according to the above-described embodiments is shown. The volumetric light emitting device may be configured to output light omni-directionally and in a way that mixes the light spectrum uniformly. That is, the light emitting device outputs approximately the same intensity of light across a wide swath, in contrast to the narrow directional beam of a conventional LED light. In contrast to individual LED lights of various colors arranged in an array, the volumetric light emitting device described herein outputs a fully mixed light spectrum. Consequently, and beneficially, the volumetric light emitting device, formed as either a light bulb or a light fixture may be configured to reflect or redirect the omni-directional light output from the volumetric conversion element into a generally directional uniform light pattern across a plant growing area.

Figure 34:
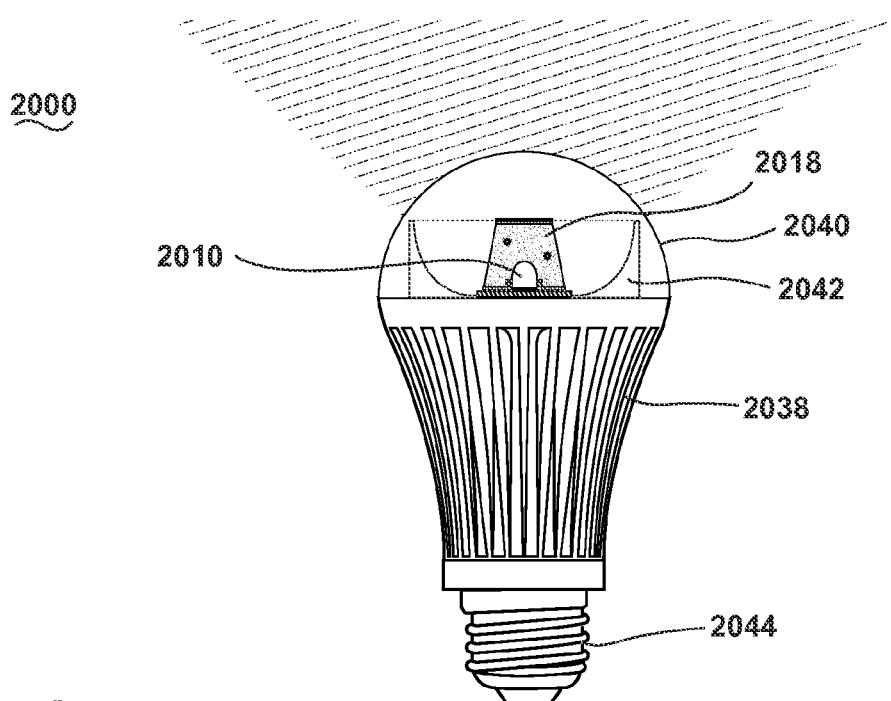
FIG. 34 illustrates a volumetric light emitting device with a heat sink, a globe and a directional reflector.

Referring now to FIG. 34, the light emitting device 2000 may include a heat sink 2038. The heat sink 2038 dissipates heat generated by the LED light source 2010. The LED light source 2010 emits light that is substantially unidirectional which is then diffused with a portion of the light down-converted in the volumetric conversion element according to the description above. The diffuse light is then projected omni-directionally from the volumetric light emitting device where a portion is then redirected by a diffuse or specular reflector 2042, external to the volumetric light conversion element 2018, that directs light in a generally uniform light distribution pattern. The light may also pass through a globe 2040 which may provide further diffusion or directionality if required. The reflector 2042 may be diffuse, specular or formed with diffuse and specular elements. The heat sink 2038 is conventionally formed such that the diameter of the heat sink proximate to the LED light source 2010 is relatively large; much larger than the width of the LED light source 2010. The heat sink 2038 then tapers to a smaller diameter as it approaches the screw connection 2044 (or other type of light connection) near the distal end of the heat sink 2038. Extended between the proximate and distal ends, the heat sink 2038 typically include a series of ribs 2046 to increase the heat sink surface area to dissipate heat. The heat sink 2038 comprises a heat conducting material. The heat conducting material may include metal, aluminum or thermoplastic depending upon the implementation.

Figure 35:
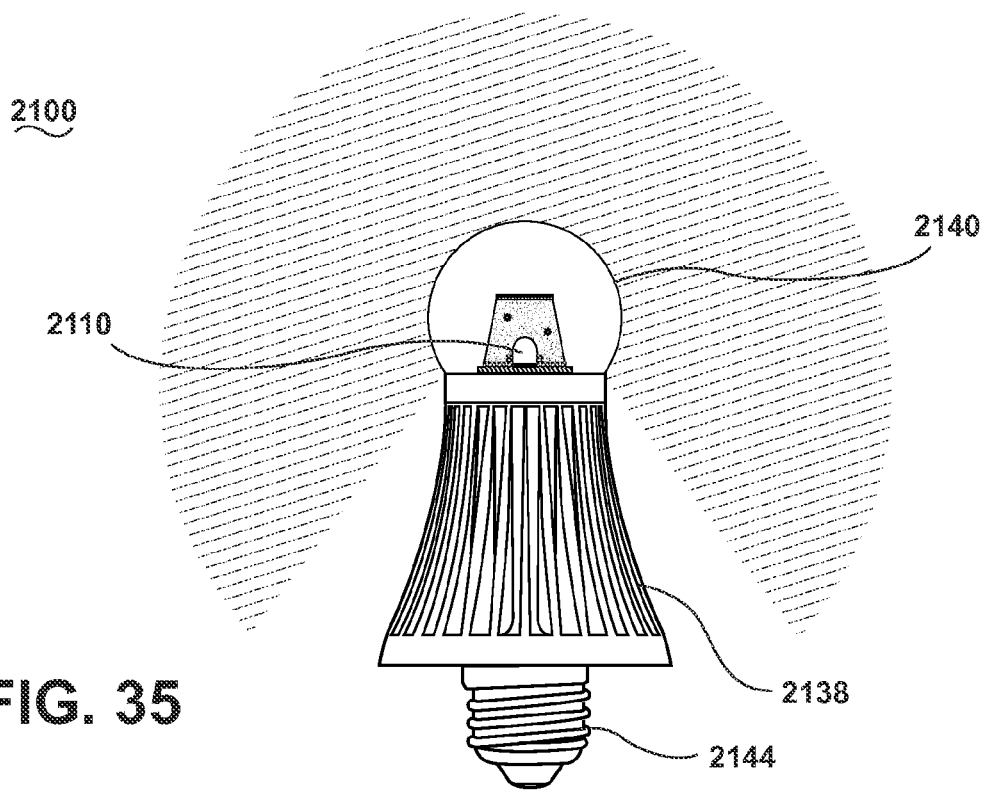
FIG. 35 illustrates a volumetric light emitting device with a heat sink and a globe.

Omni-directional lighting with a light emitting device 2100 with a heat sink 2138 is shown in FIG. 35. The light emitting device 2100 includes a heat sink 2138 formed in a shape having a smaller mass and/or diameter proximate the LED light source 2110 than a second mass and/or diameter distal from the LED light source 2110. A threaded conductive connector 2144 extends from the heat sink 2138 near the distal end for connecting the light emitting device 2110 to a standard electrical socket.

Preferably the ratio of the diameter of the heat sink 2138 distal the LED light source 2110 to the diameter of the heat sink proximate the LED light source 2110 ranges from 1.05:1 to 3.5:1, where the most preferable ratio ranges from 1.75:1 to 2.0:1.

The overall shape of the heat sink 2138 is illustrated as a quadric shape, more specifically a truncated hyperboloid. However, other shapes may be used. Forming a heat sink 2138 with the smaller diameter proximate the LED light source 2110 creates an unrestricted path for light to travel in a direction that is blocked by conventional heat sinks. Similarly, forming a heat sink 2138 with the larger diameter distal from the LED light source 2110 places the necessary material mass, ribs or other means for increasing heat sink surface area to dissipate heat further away from the light source 2110 so as not to block the output light.

When coupled with other elements of a light bulb including a globe 2140 and a threaded conductive connector 2144, the light emitting device 2100 maintains the omni-directional light pattern discussed above for uniformly illuminating plants. The light bulb may also be located well below the canopy of the growing area and inserted within the plants.

Figure 36:
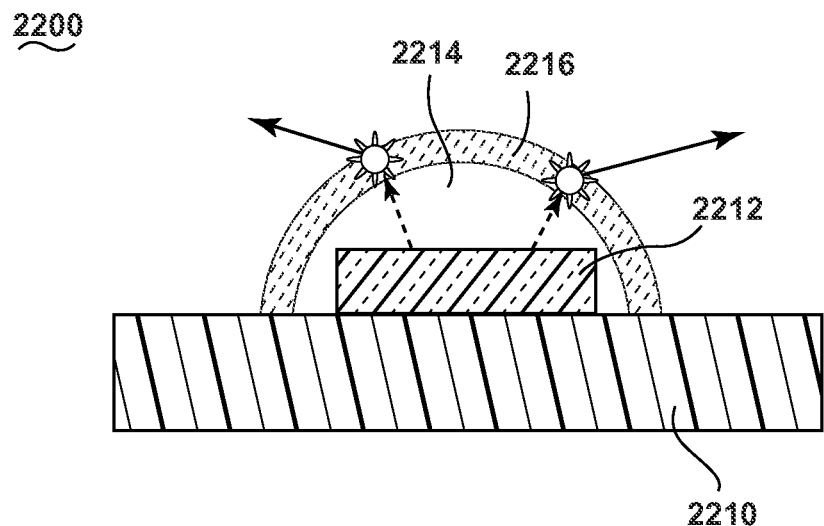
FIG. 36 illustrates a volumetric light emitting device with a chip-on-board LED.
Figure 37:
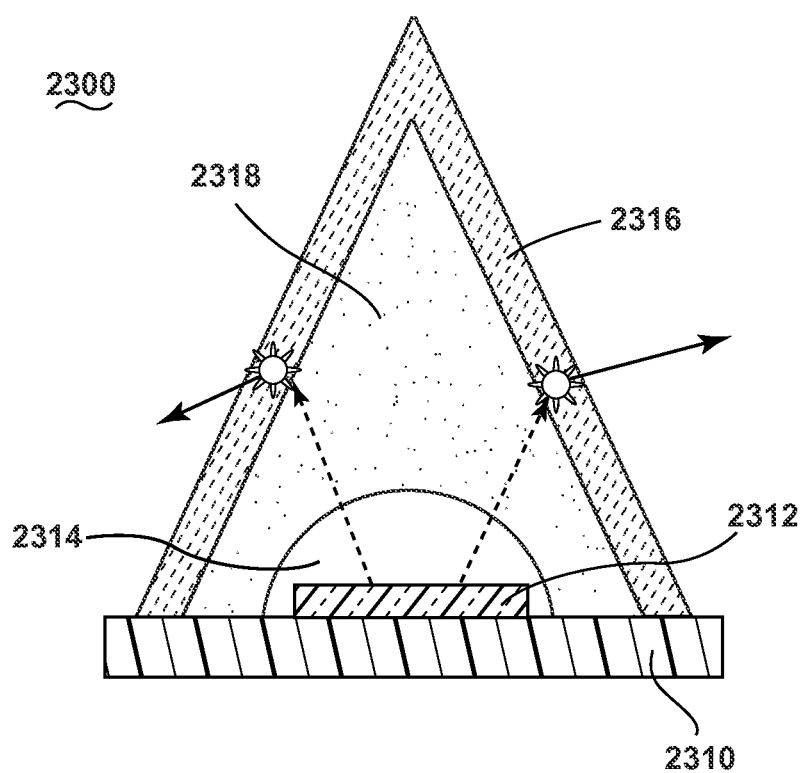
FIG. 37 illustrates another embodiment of a volumetric light emitting device with a chip-on-board LED.

The spectrally adapted light emitting device may be formed using known manufacturing techniques applicable to LED and optical technologies. For example, as shown in FIG. 36, a chip-on-board strategy may directly integrate the light emitting device 2200 onto a printed circuit board (PCB) 2210. The LED 2212 is adhered to the PCB 2210. Emitted light from the LED 2212 travels through the encapsulant 2214 and excites a phosphor in the phosphor layer 2216 that in turn emits down-converted light of a second wavelength. The light emitting device 2200 formed with the chip-on-board strategy may include any of the features described above for outputting and directing light efficient for plant growth. For example, as shown in FIG. 37, the light emitting device 2300 may be formed with a conic shape and include an additional layer 2318 of air or scattering material between the encapsulant 2314 and the phosphor layer 2316.

Any of the embodiments of the spectrally adapted light emitting device may be placed singly or in an array in a fixture for placement in a greenhouse or other plant-growing environment. For example, a light fixture, with multiple volumetric light emitters in a single fixture, with a downward reflector providing a generally rectangular light distribution pattern may beneficially provide uniform light coverage to an area targeted for plant growth. As previously described, unlike typical LED grow lights that emit light directionally and typically with a narrow range of wavelengths per unit, the volumetric light emitting device mixes the light spectrum within the volume of the light conversion element and emits light in a generally omni-directional pattern. For example, a light fixture including a 150 W power supply, heat sink, PCB board, diffuse reflector and 15 volumetric light emitting devices mounted as a single unit at a level of 3 feet above a grow area creates a 5-foot by 3.5-foot light pattern with an average light intensity of 57 $\mu moles*m^{-2}*s^{-1}$ effective PAR with a light intensity range over the entire grow area of 45 to 84 $\mu moles*m^{-2}*s^{-1}$ effective PAR. When multiple light fixtures are used at a height of 3 feet above the plant growth area, a side spacing of 6 feet and end spacing of 4 feet, the average effective light is 108 $\mu moles*m^{-2}*s^{-1}$ effective PAR with a range of 99 to 119 $\mu moles*m^{-2}*s^{-1}$ effective PAR.

While the invention has been described herein for applications relating to plant growth, other applications may include lighting for poultry, livestock, medicinal or human health, specialty streetlights, automotive and marine, military, photography, underwater, pharmaceutical, or other areas where a specially defined spectral output is desired or required and identified.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A spectrally adapted light emitting device for illuminating plants, the device comprising:
    at least one semiconductor light-emitting diode (LED) wherein the at least one LED is configured to emit at least a first wavelength between 400 nm (nanometers) and 480 nm;
    at least one light conversion element for down converting a portion of light emitted at the first wavelength to at least a second wavelength between 600 nm-680 nm; and
    at least one scattering device to diffuse light out of the at least one light conversion element;
    wherein a spectral light output from the spectrally adapted light emitting device is bi-modal with wavelengths in a range of 400 nm and 800 nm including a first local maximum between 400 nm-480 nm, a second local maximum between 600 nm-680 nm with a local minimum between the first local maximum and the second local maximum.

2. The spectrally adapted light emitting device of claim 1 wherein a photon flux of the second local maximum is larger than a photon flux of the first local maximum.

3. The spectrally adapted light emitting device of claim 1 wherein the integral of the photon flux between the local minimum and 800 nm is 3-9 times greater than the integral of the photon flux between 400 nm and the local minimum.

4. The spectrally adapted light emitting device of claim 1 wherein a Full Width Half Maximum (FWHM) at the second local maximum is between 60 nm-120 nm.

5. The spectrally adapted light emitting device of claim 1 wherein the at least one light conversion element comprises a phosphor.

6. The spectrally adapted light emitting device of claim 5 wherein the phosphor comprises phosphor particles dispersed in a resin.

7. The spectrally adapted light emitting device of claim 5 wherein the phosphor is remote from the at least one LED.

8. The spectrally adapted light emitting device of claim 1 further comprising at least one reflector.

9. The spectrally adapted light emitting device of claim 8 wherein the at least one reflector is a diffuse reflector so as to be the at least one scattering device.

10. The spectrally adapted light emitting device of claim 8 wherein the at least one reflector is a specular reflector wherein the specular reflector is configured to direct light out of the at least one light conversion element.

11. The spectrally adapted light emitting device of claim 8 wherein the at least one reflector is a reflector external to the light conversion element wherein the reflector is configured to direct at least a portion of the light output from the light conversion element in a generally uniform light distribution pattern.

12. The spectrally adapted light emitting device of claim 1 comprising a plurality of LEDs in a single fixture.

13. The spectrally adapted light emitting device of claim 1 further comprising a heat sink.

14. The spectrally adapted light emitting device of claim 1 wherein the at least one scattering device comprises at least one of a diffuse reflector or a scattering material.

15. The spectrally adapted light emitting device of claim 1 wherein the spectral light output from the spectrally adapted light emitting device is omni-directional.

16. The spectrally adapted light emitting device of claim 1 wherein the at least one LED is a chip-on-board LED.

17. The spectrally adapted light emitting device of claim 1 further including a volume of encapsulant between the at least one LED and the at least one light conversion element.

18. The spectrally adapted light emitting device of claim 17 wherein at least a portion of the volume of the encapsulant is one of a dome, a hemisphere, a cone, a cylinder, a frustoconical shape, or any combination thereof.

19. The spectrally adapted light emitting device of claim 8 wherein the at least one reflector provides a boundary for the light conversion element distal from the at least one LED.

20. The spectrally adapted light emitting device of claim 19 wherein the at least one reflector includes one of a dome, a hemisphere, a cone, a cylinder, a frustoconical shape, or any combination thereof extending axially towards the at least one LED.

21. A spectrally adapted light emitting device for illuminating plants, the device comprising:
   at least one semiconductor light-emitting diode (LED) wherein the at least one LED is configured to emit at least a first wavelength between 400 nm (nanometers) and 480 nm;
   at least one light conversion element for down converting a portion of light emitted at the first wavelength to at least a second wavelength between 600 nm-680 nm; and
   at least one scattering device to diffuse light within the light emitting device;
   wherein a spectral light output from the spectrally adapted light emitting device is bi-modal with wavelengths in a range of 400 nm and 800 nm including a first local maximum between 400 nm-480 nm, a second local maximum between 600 nm-680 nm with a local minimum between the first local maximum and the second local maximum and a photon flux of the second local maximum is larger than a photon flux of the first local maximum.

22. A spectrally adapted light emitting device for illuminating plants, the device comprising:
   at least one semiconductor light-emitting diode (LED) wherein the at least one LED is configured to emit at least a first wavelength between 400 nm (nanometers) and 480 nm;
   at least one light conversion element for down converting a portion of light emitted at the first wavelength to at least a second wavelength between 600 nm-680 nm; and
   at least one scattering device to diffuse light within the light emitting device;
   wherein a spectral light output from the spectrally adapted light emitting device is bi-modal with wavelengths in a range of 400 nm and 800 nm including a first local maximum between 400 nm-480 nm, a second local maximum between 600 nm-680 nm with a local minimum between the first local maximum and the second local maximum and the integral of the photon flux between the local minimum and 800 nm is 3-9 times greater than the integral of the photon flux between 400 nm and the local minimum.

* * * * *